(12) United States Patent
Anthony

(10) Patent No.: US 11,557,949 B1
(45) Date of Patent: Jan. 17, 2023

(54) PROPULSION SYSTEM USING SHAPE-SHIFTING MEMBER

(71) Applicant: Michael Mark Anthony, Athens, AL (US)

(72) Inventor: Michael Mark Anthony, Athens, AL (US)

( * ) Notice: Subject to any disclaimer, the term of this patent is extended or adjusted under 35 U.S.C. 154(b) by 0 days.

(21) Appl. No.: 17/737,952

(22) Filed: May 5, 2022

(51) Int. Cl.
| | |
|---|---|
| *H01L 41/09* | (2006.01) |
| *H02N 2/10* | (2006.01) |
| *H02K 16/02* | (2006.01) |
| *B64G 1/40* | (2006.01) |
| *B63H 21/17* | (2006.01) |
| *H02K 7/00* | (2006.01) |
| *B64D 27/24* | (2006.01) |

(52) U.S. Cl.
CPC ............. *H02K 16/02* (2013.01); *B63H 21/17* (2013.01); *B64D 27/24* (2013.01); *B64G 1/409* (2013.01); *H01L 41/092* (2013.01); *H02K 7/003* (2013.01); *H02N 2/10* (2013.01)

(58) Field of Classification Search
CPC ....... H01L 41/092; H01L 41/04; H01L 41/09; H02N 2/10; B64G 1/409
USPC .......................................................... 310/328
See application file for complete search history.

(56) References Cited

U.S. PATENT DOCUMENTS

2022/0037976 A1* 2/2022 Magnusson ............ H02K 37/14

\* cited by examiner

*Primary Examiner* — Derek J Rosenau
(74) *Attorney, Agent, or Firm* — Frank L. Kubler

(57) ABSTRACT

A propulsion system includes a cylindrical shaft member coupled to a motor with a motor frame; said shaft member mechanically coupled to a disc members with radius, to rotate in a dynamically and statically balanced state with said shaft when said motor rotates; the apparatus further comprising a power source to supply power to said motor to rotate said shaft member with said disc members; each said disc members comprising an annular radial array of material segments extending radially to the radius; said material segments comprising of a material that responds to electromagnetic fields to change shape radially on said disc member; such that when power is supplied to rotate the motor, the motor rotates the disc members and when each such material segment rotates to an angular location of the shaft member relative to a fixed point on the motor frame, each said material segment is supplied with said electromagnetic field; and said material responds to said electromagnetic field to change its shape radially to a new radius different from, at said angular location, and such that the mass of said material segment is redistributed radially at the radius R2 in said material segment in said angular location; and such that the difference in centripetal forces acting on said change in radial location from R1 to R2 at said angular location creates a radial force on said shaft member in the direction of the said angular location.

24 Claims, 19 Drawing Sheets

US 11,557,949 B1

PROPULSION SYSTEM USING SHAPE-SHIFTING MEMBER

FILING HISTORY

This application is a continuation-in-part of application Ser. No. 17/714,898 filed on Apr. 6, 2022.
A—Propulsion System

BACKGROUND OF THE INVENTION

1. Field of the Invention

The present invention relates generally to the field of propulsion system. More specifically the present invention relates to a uniform shape-shifting rotating disc member that changes its mass distribution at a particular angular arc segment in a radial direction due to an electromagnetic field acting upon that angular arc segment. No eccentric mechanical trajectory to guide a mass is required. The present apparatus does not go into an imbalance, since the shape-shifting is like a tidal force acting on the shape-shifting mass distribution of a disc member. The disc member has a multiplicity of shape-shifting arc segments that can respond to electromagnetic fields acting on them. Each shape-shifting arc segments passes a shape-shifting region of the apparatus at a frequency of rotation of the encoded motor multiplied by the number of such arc segment. The rotational range is 40 revs per second, to 500 revs per second. Due to physical limitations, the shape-shifting arc segments are limited to about 50 arc segments distributed around the disc member. The shape-shifting arc segments pass the region of change at a maximum potential rate of $n\omega=25$ kH. An electromagnetic tidal force is applied to one or more of shape-shifting arc segments at a particular angular portion of the disc member's perimeter to cause a depression or a bulge of the shape-shifting material. The act of radial distribution of the mass in the radial direction is very fast and is in the 500 kH to 27 MHz (megahertz) frequency, while the rotational velocity is much slower with a frequency in the 2 KH to 50 KH (kilohertz) regions. The rapid displacement of the shape-shifting arc segments is designed to do work by displacing the mass distribution in the direction of its increasing centripetal force as its radial flow increases its velocity.

The shape-shifting arc segments material passing this region of actuation is forced into this bulge by electrostatic forces. In all of this specification, the word "bulge" is commonly used and it shall equally be interpreted as a "depression", since a bulge can occur in a radial direction toward and away from the center of rotation, respectively.

An eccentric mass rotating with a shaft will cause a wobble in a frame of reference, O, that is not rotating with the shaft. The wobble is a result of offset centrifugal and centripetal forces acting in a rotational, radial and circular manner on the rotation center in O. If such a wobble is caused to locate in one direction of the frame of reference, O, then one can conceive of an approximation to a step-function that causes a directed wobble force in only one direction relative to a frame of reference, O. If now, the wobble is made with only a radial motion vector in the specified direction, it is no longer a wobble but a directed force, F, that has a radial oscillation with frequency, $\upsilon$, in O. This radial frequency aligns with the centripetal forces and will reinforce and diminish this force in an oscillatory manner. If the mass distribution is made symmetric each time the cycle starts, then the offset in radial forces at the maximum and the minimum bulge will result in a net force F, in the radial direction of the bulge. This principle is used to lift very heavy weights in governors. In governors, the force that lifts the weights is radial and its gravitational component follows the tangent of the angle of the lift bars. As the governor rises, the centrifugal force becomes radial, and even then, it's very low tangential component of the centrifugal force can hold the weights in suspense.

Prior art as piezoelectric crystal motors describe various ways to generate motions using the programmed oscillations of a piezoelectric crystal when actuated by an electromagnetic field. Electric encoded motors (motors that have encoders built in) have been made using various methods. There are no encoded motors that provide a propulsive linear force in Space by mere rotations. Rotations and wobbling in Space S, can be obtained by the eccentric behavior of rotating members. Linear and orbital propulsion can be achieved with combustible fuels, solar wind, and ion propulsion engines. Propulsion can also be achieved using a passive means such as gravitational sling of a spacecraft in orbit around a gravitating mass. No prior art demonstrates a shape-shifting apparatus that relies on rotations to generate propulsion forces.

It is known that centripetal forces vary with the radius of rotation. This fact leads to eccentrics that can generate a rotational torque difference about a center of rotation held between one part of a rotating member at a given radius of rotation and its other parts at different radii of rotations. This is just an imbalance in rotational torque that results in torsions on the shaft of the rotating apparatus and can lead to offsets in rotational orbits. However, centripetal forces cannot do work if they are orthogonal to the motion of a rotating mass that generated them. Patent WO 2016/101062 shows such an apparatus using dark matter. It depends on mechanically rotating a mass on an eccentric trajectory using a mechanical link to rotate the mass along the eccentric trajectory and generating dark matter energy. The mass wobble rotates with the shaft on the trajectory and then goes into the eccentric portion of the trajectory to generate a difference in centrifugal forces on the rotating shaft leading to orbital rotation variations. If a craft is in orbit and the eccentric mass is rotated at the right moment, it can offset the craft and cause a deviation of orbits using the wobble. However, this is not a propulsion system that can perform linear motions. Thus, the forces generated are periodic with the rotation with net zero work. This creates a lot of imbalance and possible wobble on a spacecraft.

In the present invention, no such predefined trajectory about a center with an eccentric portion for a rotating mass member is required. The gravitational sling, used on orbiting spacecrafts, is an example of radial change of mass distribution of a spacecraft in an orbit due to an active field external that changes. This orbital sling depends on the rotational kinetic energy of the spacecraft and its balance with the gravitational field attracting the spacecraft to an orbital path. The escape velocity is the tangential velocity on the orbit that is required for a given gravitating body to release the spacecraft into a elongated elliptic orbit, and finally into an almost linear trajectory that is desired. One can think of this as gravitational-tidal forces acting on the spacecraft. In 3D environments, propulsion requires multi-thrusters propelled by explosive gases generating a reactive force to propel a craft. For example, in submarines and in airplanes, control surfaces are needed to manipulate a craft that provide directional thrust. A propulsion system using encoded motors that creates a directional thrust that can be controlled without manipulating surfaces of a craft for a given direction of 3D space is of importance.

In the present invention, a uniform shape-shifting rotating disc member changes its mass distribution at a particular angular arc segment in a radial direction due to an electromagnetic field acting upon that angular arc segment. No eccentric mechanical trajectory to guide a mass is required. The present apparatus does not go into an imbalance, since the shape-shifting is like a tidal force acting on the shape-shifting mass distribution of a disc member. The disc member has a multiplicity of shape-shifting arc segments that can respond to electromagnetic fields acting on them. Each shape-shifting arc segments passes a shape-shifting region of the apparatus at a frequency of rotation of the encoded motor multiplied by the number of such arc segment. The rotational range is 40 revs per second, to 500 revs per second. Due to physical limitations, the shape-shifting are segments are limited to about 50 arc segments distributed around the disc member. The shape-shifting arc segments pass the region of change at a maximum potential rate of $n\omega=25$ kH. An electromagnetic tidal force is applied to one or more of shape-shifting arc segments at a particular angular portion of the disc member's perimeter to cause a depression or a bulge of the shape-shifting material. The act of radial distribution of the mass in the radial direction is very fast and is in the 500 kH to 27 MHz (megahertz) frequency, while the rotational velocity is much slower with a frequency in the 2 KH to 50 KH (kilohertz) regions. The rapid displacement of the shape-shifting arc segments is designed to do work by displacing the mass distribution in the direction of its increasing centripetal force as its radial flow increases its velocity.

The shape-shifting are segments material passing this region of actuation is forced into this bulge by electrostatic forces. In all of this specification, the word "bulge" is commonly used and it shall equally be interpreted as a "depression", since a bulge can occur in a radial direction toward and away from the center of rotation, respectively.

An eccentric mass rotating with a shaft will cause a wobble in a frame of reference, O, that is not rotating with the shaft. The wobble is a result of offset centrifugal and centripetal forces acting in a rotational, radial and circular manner on the rotation center in O. If such a wobble is caused to locate in one direction of the frame of reference, O, then one can conceive of an approximation to a step-function that causes a directed wobble force in only one direction relative to a frame of reference, O. If now, the wobble is made with only a radial motion vector in the specified direction, it is no longer a wobble but a directed force, F, that has a radial oscillation with frequency, $\upsilon$, in O. This radial frequency aligns with the centripetal forces and will reinforce and diminish this force in an oscillatory manner. If the mass distribution is made symmetric each time the cycle starts, then the offset in radial forces at the maximum and the minimum bulge will result in a net force F, in the radial direction of the bulge.

2. Description of the Prior Art

Prior art piezoelectric crystal motors describe various ways to generate motions using the programmed oscillations of a piezoelectric crystal when actuated by an electromagnetic field. Electric encoded motors (motors that have encoders built in) have been made using various methods. There are no encoded motors that provide a propulsive linear force in Space by mere rotations. Rotations and wobbling in Space S, can be obtained by the eccentric behavior of rotating members. Linear and orbital propulsion can be achieved with combustible fuels, solar wind, and ion propulsion engines. Propulsion can also be achieved using a passive means such as gravitational sling of a spacecraft in orbit around a gravitating mass. No prior art demonstrates a shape-shifting apparatus that relies on rotations to generate propulsion forces.

It is thus an object of this invention to provide a means of directed propulsion using electromagnetic fields and rotational symmetry of a shape-shifting member made from shape-shifting materials.

It is yet another objective of the present invention to provide for an apparatus that converts rotary motion to a linear propulsion system.

It is another objective of the invention to provide an apparatus that can be powered by one of, solar energy, a battery pack, a generator, to produce a directional propulsive force for a spacecraft in Space S.

It is another objective of the invention to provide an apparatus that can be used to propel an aircraft in a 3-dimensional space.

It is another objective of the invention to provide an apparatus that can be used to propel an aircraft in a 3-dimensional space without the need for lifting airfoils.

It is another objective of the invention to provide an apparatus that can be used to propel an aircraft in a 3-dimensional space without the need to use steering vanes.

It is another objective of the invention to provide an apparatus that can be used internally in a submarine without contacting water to propel a submarine in a 3-dimensional ocean without the need to use steering vanes.

It is another objective of the invention to provide an apparatus that can be used internally in a submarine to reduce any noise pollution.

It is another objective of the invention to provide an apparatus that can be used internally to propel a flying vehicle that can also be a road vehicle.

It is a further object of the invention to provide for an apparatus that can be scaled radially to provide for larger propulsive forces in a gravitationally free environment.

It is another objective of the invention to provide an apparatus that can be powered by a battery to produce a directional propulsive force.

It is a further object of the invention to provide for an apparatus that can provide a propulsive force that can act against a gravitational field.

It is another objective of the invention to provide an apparatus that can be used internally to reduce any noise pollution in a submarine.

It is finally objective of the invention to provide an apparatus that can be used internally to reduce any noise pollution in a aircraft.

SUMMARY OF THE INVENTION

The present invention accomplishes the above-stated objectives, as well as others, as may be determined by a fair reading and interpretation of the entire specification.

The present invention relates to a uniform shape-shifting rotating disc member that changes its mass distribution at a particular angular arc segment in a radial direction due to an electromagnetic field acting upon that angular arc segment. No eccentric mechanical trajectory to guide a mass is required. The present apparatus does not go into an imbalance, since the shape-shifting is like a tidal force acting on the shape-shifting mass distribution of a disc member. The disc member has a multiplicity of shape-shifting arc segments that can respond to electromagnetic fields acting on them. Each shape-shifting arc segments passes a shape-shifting region of the apparatus at a frequency of rotation of the encoded motor multiplied by the number of such arc segment. The rotational range is 40 revs per second, to 500 revs per second. Due to physical limitations, the shape-shifting arc segments are limited to about 50 arc segments distributed around the disc member. The shape-shifting arc segments pass the region of change at a maximum potential rate of $n\omega=25$ kH. An electromagnetic tidal force is applied to one or more of shape-shifting arc segments at a particular angular portion of the disc member's perimeter to cause a depression or a bulge of the shape-shifting material. The act of radial distribution of the mass in the radial direction is very fast and is in the 500 kH to 27 MHz (megahertz) frequency, while the rotational velocity is much slower with a frequency in the 2 KH to 50 KH (kilohertz) regions. The rapid displacement of the shape-shifting arc segments is designed to do work by displacing the mass distribution in the direction of its increasing centripetal force as its radial flow increases its velocity.

The shape-shifting arc segments material passing this region of actuation is forced into this bulge by electrostatic forces. In all of this specification, the word "bulge" is commonly used and it shall equally be interpreted as a "depression", since a bulge can occur in a radial direction toward and away from the center of rotation, respectively.

A frame of reference, O, that is not rotating with the shaft. The wobble is a result of offset centrifugal and centripetal forces acting in a rotational, radial and circular manner on the rotation center in O. If such a wobble is caused to locate in one direction of the frame of reference, O, then one can conceive of an approximation to a step-function that causes a directed wobble force in only one direction relative to a frame of reference, O. If now, the wobble is made with only a radial motion vector in the specified direction, it is no longer a wobble but a directed force, F, that has a radial oscillation with frequency, $\upsilon$, in O. This radial frequency aligns with the centripetal forces and will reinforce and diminish this force in an oscillatory manner. If the mass distribution is made symmetric each time the cycle starts, then the offset in radial forces at the maximum and the minimum bulge will result in a net force F, in the radial direction of the bulge.

Prior art as piezoelectric crystal motors describe various ways to generate motions using the programmed oscillations of a piezoelectric crystal when actuated by an electromagnetic field. Electric encoded motors (motors that have encoders built in) have been made using various methods. There are no encoded motors that provide a propulsive linear force in Space by mere rotations. Rotations and wobbling in Space S, can be obtained by the eccentric behavior of rotating members. Linear and orbital propulsion can be achieved with combustible fuels, solar wind, and ion propulsion engines. Propulsion can also be achieved using a passive means such as gravitational sling of a spacecraft in orbit around a gravitating mass. No prior art demonstrates a shape-shifting apparatus that relies on rotations to generate propulsion forces.

It is known that centripetal forces vary with the radius of rotation. This fact leads to eccentrics that can generate a rotational torque difference about a center of rotation held between one part of a rotating member at a given radius of rotation and its other parts at different radii of rotations. This is just an imbalance in rotational torque that results in torsions on the shaft of the rotating apparatus and can lead to offsets in rotational orbits. However, centripetal forces cannot do work if they are orthogonal to the motion of a rotating mass that generated them. Patent WO 2016/101062 shows such an apparatus using dark matter. It depends on mechanically rotating a mass on an eccentric trajectory using a mechanical link to rotate the mass along the eccentric trajectory and generating dark matter energy. The mass wobble rotates with the shaft on the trajectory and then goes into the eccentric portion of the trajectory to generate a difference in centrifugal forces on the rotating shaft leading to orbital rotation variations if a craft is in orbit and the eccentric mass is rotated at the right moment, it can offset the craft and cause a deviation of orbits using the wobble. However, this is not a propulsion system that can perform linear motions. Thus, the forces generated are periodic with the rotation with net zero work. This creates a lot of imbalance and possible wobble on a spacecraft.

In the present invention, no such predefined trajectory about a center with an eccentric portion for a rotating mass member is required. The gravitational sling, used on orbiting spacecrafts, is an example of radial change of mass distribution of a spacecraft in an orbit due to an active field external that changes. This orbital sling depends on the rotational kinetic energy of the spacecraft and its balance with the gravitational field attracting the spacecraft to an orbital path. The escape velocity is the tangential velocity on the orbit that is required for a given gravitating body to release the spacecraft into a elongated elliptic orbit, and finally into an almost linear trajectory that is desired. One can think of this as gravitational-tidal forces acting on the spacecraft. In 3D environments, propulsion requires multi-thrusters propelled by explosive gases generating a reactive force to propel a craft. For example, in submarines and in airplanes, control surfaces are needed to manipulate a craft that provide directional thrust. A propulsion system using encoded motors that creates a directional thrust that can be controlled without manipulating surfaces of a craft for a given direction of 3D space is of importance.

In the present invention, a uniform shape-shifting rotating disc member changes its mass distribution at a particular angular arc segment in a radial direction due to an electromagnetic field acting upon that angular arc segment. No eccentric mechanical trajectory to guide a mass is required. The present apparatus does not go into an imbalance, since the shape-shifting is like a tidal force acting on the shape-shifting mass distribution of a disc member. The disc member has a multiplicity of shape-shifting arc segments that can respond to electromagnetic fields acting on them. Each shape-shifting arc segments passes a shape-shifting region of the apparatus at a frequency of rotation of the encoded motor multiplied by the number of such arc segment. The rotational range is 40 revs per second, to 500 revs per second. Due to physical limitations, the shape-shifting arc segments are limited to about 50 arc segments distributed around the disc member. The shape-shifting arc segments pass the region of change at a maximum potential rate of $n\omega=25$ kH. An electromagnetic tidal force is applied to one or more of shape-shifting arc segments at a particular angular portion of the disc member's perimeter to cause a depression or a bulge of the shape-shifting material. The act of radial distribution of the mass in the radial direction is very fast and is in the 500 kH to 27 MHz (megahertz) frequency, while the rotational velocity is much slower with a frequency in the 2 KH to 50 KH (kilohertz) regions. The rapid displacement of the shape-shifting arc segments is designed to do work by displacing the mass distribution in the direction of its increasing centripetal force as its radial flow increases its velocity.

The shape-shifting arc segments material passing this region of actuation is forced into this bulge by electrostatic forces. In all of this specification, the word "bulge" is commonly used and it shall equally be interpreted as a "depression", since a bulge can occur in a radial direction toward and away from the center of rotation, respectively.

An eccentric mass rotating with a shaft will cause a wobble in a frame of reference, O, that is not rotating with the shaft. The wobble is a result of offset centrifugal and centripetal forces acting in a rotational, radial and circular manner on the rotation center in O. If such a wobble is caused to locate in one direction of the frame of reference, O, then one can conceive of an approximation to a step-function that causes a directed wobble force in only one direction relative to a frame of reference, O. If now, the wobble is made with only a radial motion vector in the specified direction, it is no longer a wobble but a directed force, F, that has a radial oscillation with frequency, $\upsilon$, in O. This radial frequency aligns with the centripetal forces and will reinforce and diminish this force in an oscillatory manner. If the mass distribution is made symmetric each time the cycle starts, then the offset in radial forces at the maximum and the minimum bulge will result in a net force F, in the radial direction of the bulge.

A good model for the present invention is the tidal force generated by the Moon on the Oceans. The following table shows the comparative model:

In the present invention, the bulging "or contraction" of the shape-shifting arc segments does not rotate with the disc member. Like the tidal bulge, the bulging "or contraction" of the shape-shifting arc segments is designed to remain at the same small relative angular location as the forces that create it. For simplicity we will only deal with bulging of the disc member, however, the same effect in reverse can be obtained by a depression of the disc member during rotations. A piezoelectric crystal can be made to oscillate in a variety of directions and shapes depending on the loading of its oscillation frequencies in a circuit.

Advantageously, shape-shifting arc segments of the present invention are preferably made using stacked piezoelectric crystal actuators that oscillate in a particular manner to keep their mass elements in the same angular orientation during rotation. Thus, one can imagine the shape-shifting arc segments as countering any rotational vectors as their radial location increases and decreases to gain a net displacement in a radial direction that is fixed in the reference frame, O. This can be done by programming the motions to perform the motion relative to the rotation rate of the disc member. When the massive elements of such a shape-shifting arc segment arrive at a maximum or a minimum radial location, its relaxation can be temporarily held through a small angle and then allowed to go back to its relaxed state as the next shape-shifting arc segment comes into play to repeat the cycle.

TABLE 1

| Comparative elements of model | | |
| --- | --- | --- |
| Earth | Disc member | Both rotating about a center |
| Moon | Electromagnetic source | Both sources of fields are external |
| Oceans on rotating Earth | Shape-shifting arc segments on rotating disc member | Both can change their shape when a field is applied |
| Gravitational tensile force of Earth acting on Oceans to keep earth round. | Electromagnetic tensile force of disc member's Shape-shifting arc segments to keep disc member round | Both are internal |
| Tidal bulge on rotating Earth | Shape-shifted arc segments on rotating disc member | Both respond to a field to change their shape radially. |
| If the gravitational field of either Earth or Moon changes even slightly, the tidal bulge will increase or decrease and potential work is done. | If the Electromagnetic field of either the Shape-shifting arc segments or the electromagnetic field. E, changes even slightly, the bulge will increase or decrease and potential work is done | Both can do work. |

It is easy to compare the two models using TABLE 1.

The gravitational tidal force of the Moon (field source) on a rotating Earth (rotating disc member) with shape-shifting Oceans (shape-shifting arc segments), can be imagined to be acting against the gravitational tension of the Earth (internal molecular forces) holding a shape-shifting Ocean to the rotating Earth Thus, one can compare this to a shape-shifting material (Ocean) that has tensile strength due to its atomic structure holding its parts together (gravity) on a rotating disc member (Earth). Hence, in the analogy, the material's tensile strength of the disc member is equivalent to the Earth's gravitational field holding its Oceans together, and the shape-shifting material can be compared to the Ocean. The shape-shifting Ocean arc segments in a tide on a rotating Earth (disc member) are equivalent to the shape-shifting arc segments of the present apparatus on a rotating disc member.

The tidal bulge of the Earth is ever present along the line joining the Earth's center to the Moons center, where the Moon's gravitational field is applied. In a similar manner, the bulge of the shape-shifting disc member is ever present in a preferred angular direction in the rotation plane of the disc member where an electromagnetic field is applied. The electromagnetic field causing a bulging of the disc member is equivalent to the Moon's gravitational field causing a bulging of the Ocean. The bulge of the shape-shifting Ocean arc segments is an equivalent model to the bulge of the shape-shifting arc segments of this invention.

In the present invention, the force that makes the bulge on the disc member is generated by an electromagnetic field pointing either away from the disc member's center or toward the disc member's center in the Earth-Moon-Ocean model, the force that makes the tidal bulge is generated by an attractive gravitational force between the Oceans and the Moon, also pointing in a radial direction of the rotating Earth towards the tidal bulge.

Note that to keep the Earth-Moon system in a stable orbital trajectory, the centrifugal forces generated by the rotating Earth balance must balance the gravitational tensile ray between the Moon and the Ocean's tidal bulge on the rotating Earth.

Note that centrifugal and centripetal forces generated by the rotating disc member, balances the electromagnetic tensile ray acting in the shape-shifted arc segments of the rotating disc member. In the frame of reference common to the Earth-Moon system, the gravitational tensile ray between the Moon and the Earth remains constant and spread over a small angle.

The shape-shifting arc segment material's tensile ray between the center of the disc member and the applied field, E, that causes the bulge is also directed at a particular angle, $\theta$, in their joint frame of reference, O. In the present invention, the Electromagnetic source that produces the "tide" (bulging of the shape-shifting arc segment) is also external to the disc member's shape-shifting arc segments. The Moon is not present inside of the Earth to produce its "tides". It is external. In the present invention, the Electromagnetic source that produces the "tide" (bulging of the shape-shifting arc segment) is also external to the disc member's shape-shifting arc segments but acts internally on the disc member's shape-shifting arc segments. Changing this electromagnetic field is the equivalent of changing the Earth's gravitational field strength. By changing the electromagnetic field of the shape-shifting arc segments, one can change the radial distribution of matter of the bulge on the disc, and the shape-shifting arc segments are allowed to increase or decrease their radial mass distribution relative to the rotating the disc member in the given direction of choice. By changing the Earth's gravitational field, one can change the radial distribution of mass of the Ocean's tidal bulge and this will increase or decrease their radial tide's mass distribution relative to the rotating Earth. However, it must come to notice that changing the gravitational of the Earth or the Moon should result in a relative change of radial orbits and hence a force of motion away from their centroid of rotation is created. This is an increase in Torque if the speed of the motor is constant. Hence the motor generates this torque at the expense of its energy into the shift in mass distribution. The energy balance is required that the motor should be specified to do the work required to be done by the apparatus when in use. As little of this energy as possible comes from the force required by the electromagnetic field, E, to move the mass distribution.

In the Earth-Moon model, the Moon is external to the Earth and they are always falling toward each other but kept apart by the centripetal and centrifugal forces of rotation caused by their orbital rotations about each other. In the apparatus, there is no external orbiting centrifugal forces acting other than those generated by the rotation of the disc member parts. The angular rotational speed of any point on the bulge remains constant over time relative to the applied angle of activation of the bulge. The bulge is made radially and so the mass elements of the shape-shifting arc segments are continuously subject to the same shape of the bulge, the bulge remains independent of the rotation. Thus, all the mass elements of the disc member must pass and form the bulge. Therefore, just as the Ocean tidal wave has little or no rotational vectors (apart from miniscule gravitational drag and miniscule frictional drag) from the rotating Earth acting upon it in a tangential direction of the rotational disc of the Earth, the bulge of the shape-shifting arc segments has little or no rotational vectors acting upon (apart from miniscule electromagnetic drag) it on the tangential direction of the rotating disc member. This bulge does not rotate with the shaft but it generates a tensile force that tends to pull the masses toward the top of the tidal direction as massive elements pass through it. If there is nothing holding the shaft back, there will be a reaction to the action of stroke elongation that tends to push the shaft back away from the bulge. The centripetal forces of the shape-shifting arc segments passing through the bulge are greater than those of the "unbulged"-areas. In-fact there is an overall balance of such forces around the shaft, except at the bulge, which generates a difference of forces, F, in that direction only. This difference in forces, F, is not countered by the reaction to the bulging forces. It is a real force. The masses on the entire disc member will always be in perfect rotational balance, just as the Earth is always in rotational balance even with the tidal bulge with respect to time. As long as the centripetal force of imbalance is greater than the force exerted by the reaction on the shaft, there will be a net force acting on the shaft in the direction of the bulge only, and this can be used to do work.

In the Earth-Moon model, the centripetal radial forces that hold them together to a nearly circular orbit that balances the centrifugal forces that the Earth's tide creates. Unlike the Earth-Moon model, an electromagnetic tidal force has been created on the disc member that has no external source of rotation centrifugal force that counters and offsets the centrifugal forces generated by the bulge about an external center (like the center of the orbits of the Earth Moon system). Hence the apparatus will always have a net freedom to move along the tensile ray as its matter progressively migrates in that direction, $\theta$ and generates a centripetal force difference, F. There is an attraction force of the rotating disc member to migrate towards the direction of the continuous flow of its matter. This force, F, causes a net movement of the entire apparatus in that direction. One can imagine that the bulge of material due to the electromagnetic energy is like an external gravitational field imparted on the mass of the shape-shifting arc segments in a continuous manner, but unlike the Earth and the Moon orbiting each other and held at "fixed" orbits by centrifugal forces, there is no centrifugal force stopping the shaft from migrating in the radial direction of the mass flow when the material returns to its state of no electromagnetic stress as its internal stresses pull the material in that direction. In other words, if the Earth does not orbit about the Moon and vice-versa, they will fall towards the Ocean's tidal bulge. One can think of the bulge as created by an imaginary non-orbiting Moon, since the bulge is created by an Electromagnetic field that has no orbital character.

It is clear that due to the force, F, that arises, a rotational orbit must be generated by the apparatus that tends to rotate the apparatus about a center of mass as if the disc member (Earth) is orbiting about some body. Such is the great symmetry required by the laws of Nature. This orbital imbalance (as opposed to rotational imbalance) will require the apparatus to have at least 2 disc members as will be described later.

When either a compressive force (pressure), or, a tension force is applied to a shape-shifting material such as a ceramic piezoelectric crystal, a voltage develops across the shape-shifting material surfaces generated by an offset of its molecules' ionic structure from a balanced state. Conversely, when an electromagnetic field is applied to the shape-shifting material, the shape-shifting material responds by extending (elongating) and contracting, generating a force. There is a longitudinal mode effect (deformation colinear voltage and applied voltage are linear) and a transverse mode effect (deformation is perpendicular to the voltage). A cycle of both modes can be designed to cause specific oscillations of the material's dimensions by manipulating an electromagnetic field applied to the crystal surfaces to allow a defined shape of the shape-shifting material to be achieved. This defined motion occurs in three states of the shape-shifting material. A relaxed normal state, a contracted state, and extended state.

Similarly, when either a compressive force (pressure), or, a tension force is applied to a magnetic shape-shifting material, a resistive electromagnetic field develops across the material surfaces generated by an offset of its molecules' ionic structure from a balanced state. Conversely, when an electromagnetic field is applied to the magnetic shape-shifting material, the magnetic shape-shifting material responds by extending (elongating) and contracting, generating a force. There is a longitudinal mode effect (deformation colinear voltage and applied voltage are linear) and a transverse mode effect (deformation is perpendicular to the voltage). A cycle of both modes can be designed to cause specific oscillations of the material's dimensions by manipulating electromagnetic fields applied to the material surfaces to allow a defined shape of the shape-shifting material to be achieved. This defined motion occurs in three states of the magnetic shape-shifting material. A relaxed normal state, a contracted state, and extended state. No prior art describes various ways to generate propulsion motions in free space using the movements of shape-shifting materials when actuated by electromagnetic fields.

In both the magnetic and non-magnetic shape-shifting materials, a shape-shifting occurs resulting in dimensional changes of the material in preferred directions. As such I will call such material "shape-shifting materials". Any rapidly shape-shifting material can be used to construct the apparatus 10 and its components.

In general, when a shape-shifting material is made, it is caused by an external electromagnetic field to induce a center of charge of the generally neutral ionic structure of the material. This induces a reorganization of the ionic lattice into a particular "poled" shapes. The "poling polarity" determines the behavior of the shape-shifting material. Shape-shifting materials go through a poling hysteresis loop (either an electrification and a magnetization loop) as they are activated, and then, relax.

In a similar manner, magnetic semi-solids, magnetic fluids and piezoelectric crystals undergo the same process. While the foregoing description is with shape-shifting materials forming the disc member, nothing prevents one from using a disc member that can fluidly change shape by application of external fields that can influence the material. These include, electric, magnetic, and electromagnetic fields. Every aspect of the invention equally applies to all shape-shifting material. As such the shape-shifting technology implies any rapid shape-shifting material (micro-seconds response time) can be used to make the disc members of the foregoing description of the apparatus.

BRIEF DESCRIPTION OF THE DRAWINGS

Various other objects, advantages, and features of the invention will become apparent to those skilled in the art from the following discussion taken in conjunction with the following drawings, in which.

DETAILED DESCRIPTION OF THE PREFERRED EMBODIMENTS

Figure 1:
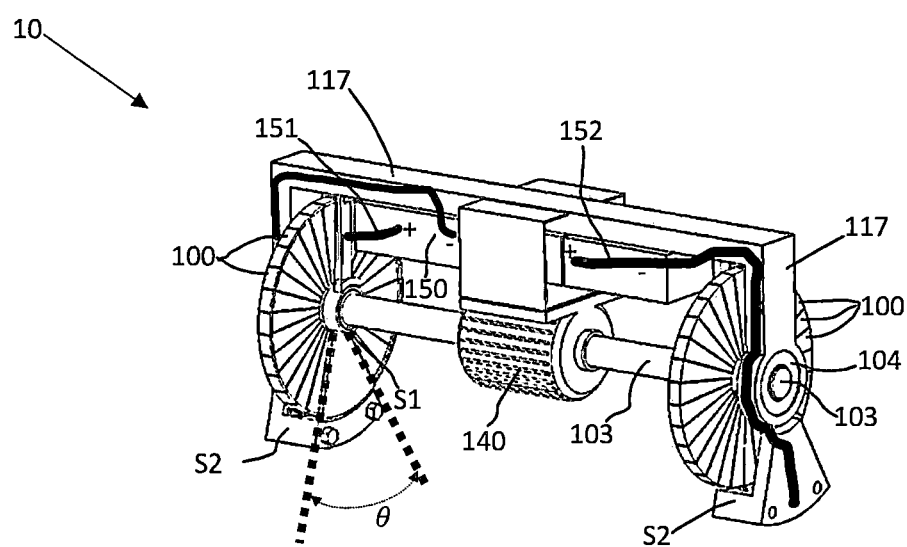
FIG. 1 shows the apparatus used in a dual configuration of disc members with an encoded motor, and a power source.

As required, detailed embodiments of the present invention are disclosed herein, however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Reference is now made to the drawings, wherein like characteristics and features of the present invention shown in the various FIGURES are designated by the same reference numerals.

Preferred Embodiments

Referring to FIGS. 1-20, the first embodiment is as follows.

For the purposes of explanation only, the following definitions apply.

1. The apparatus 10 is oriented in a frame of reference O, with three perpendicular axes, x, y, z, defining a Space S, [x,y,z]. The x, and z, axes are taken as horizontal on the [x,z] plane, relative to the apparatus, and the y-axis is taken as vertical.

2. A shaft member 103's axis is centered to rotates about the [x,z], and is preferably symmetrical in its span, on both sides of an encoded motor 140 it is attached to.

3. In Space S, these axes are treated as non-oriented with respect to the words vertical, and horizontal.

4. The vertical plane of symmetry refers to the [y,z] and the [x,y] planes of rotation of the disc members 200 centered on the disc member 200's plane of rotation.

5. The horizontal plane of symmetry, refers to the horizontal plane [x,z] that passes though the axis of rotation of a shaft member 103.

6. The word vertical has no meaning in Space S, without a gravitational field, G, and as such is only used for descriptive reference, O, that the orientation of vertical along the y-axis.

7. Poling field, shall mean, the electromagnetic field $V_P$, that is applied to a shape-shifting material during manufacture to generate an offset of its electromagnetic structure generating a directed electromagnetic field, E, in the shape-shifting material 100.

8. Shape-shifting material 100 shall mean any material that can be poled with poled voltages $V_P$, with at least the following properties;

a. A compressive force applied to the shape-shifting material 100 in poling direction generates an electromagnetic field, $V_G$ with a polarity opposite to poling field, $V_P$.

b. A tensile force applied in poling direction of the shape-shifting material generates an electromagnetic field, $-V_G$, with a polarity similar to poling electromagnetic field, $V_P$.

c. An electromagnetic field, E, with polarity similar to the poling electromagnetic field $V_P$, of the shape-shifting material 100 induces contraction in length of the shape-shifting material 100.

d. An electromagnetic field, E with polarity opposite to the poling electromagnetic field $V_P$, of the shape-shifting material 100 induces an extension in length of the shape-shifting material 100.

Figure 8:
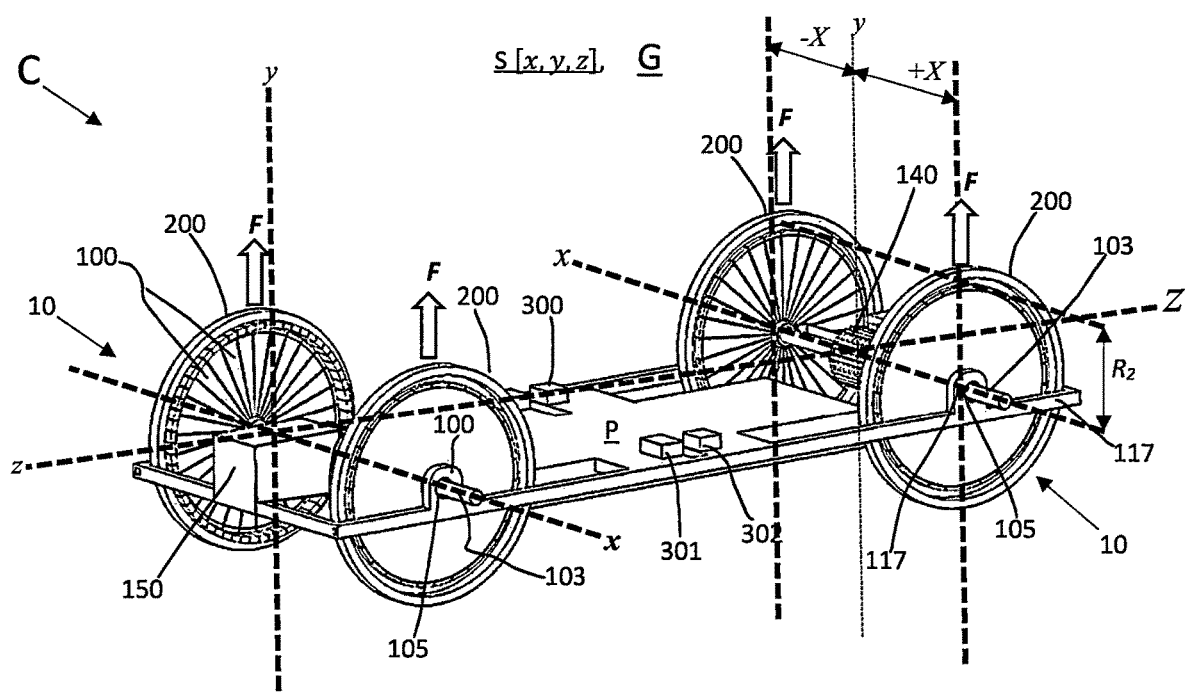
FIG. 8 shows a typical vehicle application of the apparatus with controllers and a frame.

With the above arrangement, define three perpendicular axes in a frame of reference, O, of the apparatus 10, The axis, x, y, z, defining a Space S, [x,y,z], as shown in FIG. 8. The shaft member 103, axially locates on the x-axis, to rotate symmetrically on the [x,y] plane. Each shaft member 103, holds 2 parallel disc members 200, symmetrically placed on opposite sides of an encoded motor 140, to rotate with the shaft member 103's axial center. Each disc member 200 has the common activation contact ring 105 and the arc segment activation contacts 106 attached respectively to the shape-shifting arc segments 100 to form two dynamically and statically balanced radial arrays around the shaft member 103 in two distal parallel [y,z] planes perpendicular to the x-axis. The disc members 200 are symmetrically positioned at equal distances, ±X, about the origin, x=0, z=0, where, $$\pm X = \sqrt{x^2 + z^2},$$

in parallel planes, [+X,y] and [−X,y,]. Thus, the shaft members 103 can be placed in various locations that form a symmetric pattern about the origin depending on their x, z, coordinates. The distance ±X, from the origin of the disc members is determined by the array of shaft members 103 used for a given apparatus 10. The shaft members 103 can be made to form a parallel set of two shaft members 103, a triangulation of three shaft members 103 about x=0, z=0, a quadrature of four shaft members 103 about the point x=0, z=0, and many other possible geometric shapes about the origin. The distance X, is not of consequence other than to make sure there is no interference between the shaft members 103 and the disc members 200. The number of shaft members 103 is determined by the configuration selected for the apparatus 10, and the required motions it is desired to execute. The distance X can be adjusted to allow for the desired dynamic response of the apparatus 10 when used to propel a vehicle C.

The disc members 200 can freely rotate in the planes [+X,y] and [−X,y], perpendicular to the [x,z] rotations of the shaft members 103. Advantageously, the array of shape-shifting arc segments 100 forms a symmetric and statically and dynamically balanced radial array in the origin of the Space S A. Advantageously, the array of arc segment activation contacts 106, form a symmetric circular array in in the axis of rotation of any disc member 200.

An apparatus 10, comprising a pair of rotating shape-shifting disc members 200 with special characteristics for changing their shape during fast rotation, is revealed. The apparatus 10 functions as a propulsion system for a vehicle C, in Space S, and can also function as a propulsion system for a vehicle C, in a gravitational field, G. The apparatus 10 requires energy from an encoded motor 140, powered by an external power source 150, such as a battery pack, a solar panel and other forms of electromagnetic energy E.

Paired sets of rapidly rotating symmetrical, statically and dynamically balanced annular disc members 200 are rotated by an encoded motor 140's shaft member 103. The disc members 200 have shape-shifting properties and be induced by electromagnetic fields, E, to preferably change the symmetry of the disc members 200, to generate directional moments and cause propulsion in a given direction. Each paired set of disc members 200 is symmetrically positioned in the frame of reference O, of the apparatus, to rotate in parallel planes that are perpendicular to their shaft member 103's axis. The frame of reference, O, may be either in Space S. or in a gravitational field, G.

Preferably, each pair of disc members 200 is symmetrically placed relative to an encoded motor 140.

The disc members 200 are made up of a multitude of shape-shifting arc segments 100 each subtending a small radial arc, θ. Therefore, each disc member 200 must have a very fine angular gradation of electromagnetically separated, and isolated, shape-shifting arc segments 100. In general, the finer the gradation of the shape-shifting arc segments 100, the better the apparatus 10 works for its intended purposes.

The shape-shifting arc segments 100 of each disc member 200 are actuated at a particular angular orientation, θ, to change their shape radially or circumferentially in that angular location only, in the frame of reference, O. During the formation of a disc member 200, the shape-shifting arc segments 100 are made as small separated shape-shifting arc segments 100 of the disc member 200 to prevents one shape-shifting arc segments 100 from affecting the other when an electromagnetic field E, is applied to one. The shape-shifting arc segments 100, form a part of the annular disc member 200, with shape-shifting arc segments inner radius contact face 101, of radius, $R_1$, and with shape-shifting arc segments outer radius contact face 102, of radius, $R_2$.

Advantageously, the array of shape-shifting arc segments 100 forms a symmetric and statically and dynamically balanced array in the frame of reference, O.

The pair of electromagnetically reactive disc members 200 are made to function as poled shape-shifting materials, with radial poled directions with respect to their axis of rotation. The disc members 200 are attached to the shaft member 103 to rotate with the shaft member 103 in a plane perpendicular to the axis of rotation. The disc members 200 are in a rotationally, a dynamically, and a statically balanced state with the shaft member 103 and the encoded motor 140. The disc members 200 are preferably annular discs with shape-shifting arc segments 100 that have radial outer boundary surfaces equally distributed in a symmetric array around the center of rotation as shown in FIGS. 1-8.

In the case for example, of electrically reactive shape-shifting materials, the disc members 200 can be made from a suitable shape-shifting material such as ceramic piezoelectric materials and from standard actuators from Ceram Tec, from PZT material and from Noliac, PMN-PT materials. These materials and actuators can be embedded in polymers, in PZT materials from APC Ceramics, and in from PICMA. At present, there are five types of shape-shifting materials (materials that respond to pressure and tension caused by electromagnetic fields): electrostatic fluids, magnetic fluids, magnetic solids, and piezoelectric materials made from ceramic composites, polymers, and single crystals materials. Shape-shifting single crystals piezoelectric materials have generally stronger shape-shifting properties and can easily be made to fit this application. Other types of shape-shifting materials can be composed using composite metals such as Nitinol composites that can react to electromagnetic currents when cooled and heated.

Ferroelectric single piezoelectric material crystals such as lead-titanate [PbTiO3], and PNN, lead-nickel-niobate, [Pb(Ni⅓Nb2/3)O3] are widely used materials in shape-shifting material manufacturing for specific encoded motor purposes.

PVDF (polyvinylidene difluoride) is a semi-crystalline polymer with a high-energy density and contains about 48% crystals embedded in a polymeric matrix. They are easy to shape, and resilient. They are suitable for surfaces such as discs and spheres. Their shape-shifting in these materials is the result of orientation polarization of molecular dipoles. These polymers include polyimide and polyvinylidene chloride (PVDC).

Preferably the disc member 200 is made from a polymetric material and formed into a radial array of small independent shape-shifting arc segments 100 with a high-energy density that contain about 10%-90% shape-shifting materials embedded in their polymeric matrix.

During the formation of a disc member 200, the shape-shifting arc segments 100 made separated from one another by a very small boundary gap 110, (a few hundred micrometers). The boundary gap 110 are filled with electrically non-conductive elastomeric materials such as a strong flexible and non-conductive silicones, and other types of epoxies. The boundary gap 110 prevents one shape-shifting arc segments 100 from affecting the other when an electromagnetic field, E, is applied to one and not the other. The shape-shifting arc segments 100 form an annular disc shape with a shape-shifting arc segments 100 inner radius contact face, 101, of radius, $R_1$, and with shape-shifting arc segments 100 outer radius contact face 102, of radius, $R_2$.

The shape-shifting arc segments 100 inner radius contact faces 101, connect electromagnetically and conductively to a concentric and cylindrical electromagnetically conductive ring which acts as a common activation contact ring 105. The common activation contact ring 105 can be attached to the shape-shifting arc segment inner radius contact face 101 using either metallized coatings or an electromagnetically conductive glue, such as a silver paste soldering. Silver pastes need very low heat to fuse the common activation contact ring 105 to the shape-shifting arc segments 100. There are Kynar™ materials and other conductive tapes that may be used to attach the common activation contact ring 105 and the arc segment activation inner radius contact faces 101, respectively. Companies like Dycotec Materials, offer a range of nano, and micron flake, conductive silver pastes, that can be used. Conductive cement pastes, with conductive particles of copper, steel, and other materials may also be used as a glue. Lead-free solder and such as Superior No. 30 Halide flux, commonly used in the industry can also be used to conductively attach the common activation contact ring 105, and the arc segment activation contacts 106, respectively, to the shape-shifting arc segments 100. The shape-shifting arc segments 100 can also be made from multiple units of shape-shifting actuators that are placed in concentric radii and stacked to form separate shape-shifting arc segments of the disc member 200 as shown in FIGS. 5, 6, 7, 12 and 13. Piezoelectric crystal actuators are generally stacked together to form long stroke actuators. This allows one to change the extension of any shape-shifting arc segment 100 by simply actuating the selected shape-shifting arc segments to extend, or contract them either radially as previously described, or circumferentially as desired. The radial mass density of the any selected shape-shifting arc segments 100 can be altered and controlled by extending or contracting that particular segment.

The common activation contact ring 105 is non-conductively coupled to the shaft member 103 with an insulating cylindrical sleeve 104, to prevent any electromagnetic fields, E, applied to the common activation contact ring 105, from contacting the shaft member 103. The insulating cylindrical sleeve 104, mechanically rotates with the common activation contact ring 105 and so does the entire disc member 200 it is attached to. The shaft member 103 can be made from a suitable material, such as, a plastic, and a metal such as for example, aluminum, and stainless steel.

Polymer-based piezoelectric based shape-shifting material actuators, provide large forces (few μN), and can be made as thick polymeric shape-shifting films, forming the shape-shifting arc segment 100. The shape-shifting constant $d_{uv}$ can be in the range of 10-12 Colombes/Newton, with an acoustic impedance of over 100

$$\frac{Pa \cdot s}{m^3}.$$

Appropriate circuits 300 can be constructed to simply control the operations of apparatus 10 and provide both rotational control and voltage differences needed to control the shape-shifting arc segment 100 as desired. The apparatus 10 may further comprise an encoded motor controller 301 to control the rotational speed to, of the encoded motor 140, and the to generate the exact oscillatory motion of the shape-shifting arc segment 100 that is needed. A propulsion circuit 302 may also be provided to control the rotational speed ω, of the encoded motor 140, of each pair of disc members 200 to offset any forces that may be required to create a difference in torques that can be used to drive the vehicle C, in different orientations of the Space S, [x,y,z].

Figure 9:
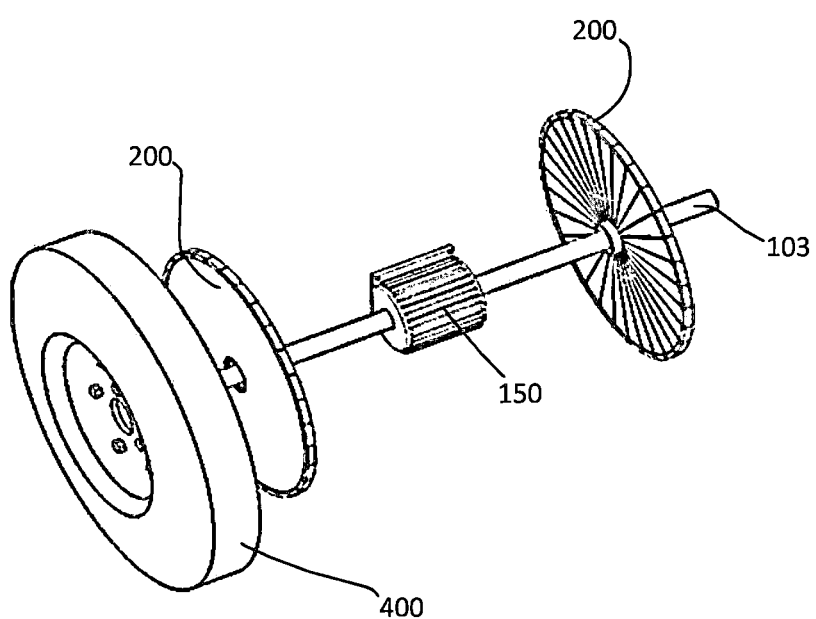
FIG. 9 shows how a wheel for a vehicle such as a car can be incorporated to be driven by both the encoded motor's rotation and by the apparatus's force F.
Figure 10:
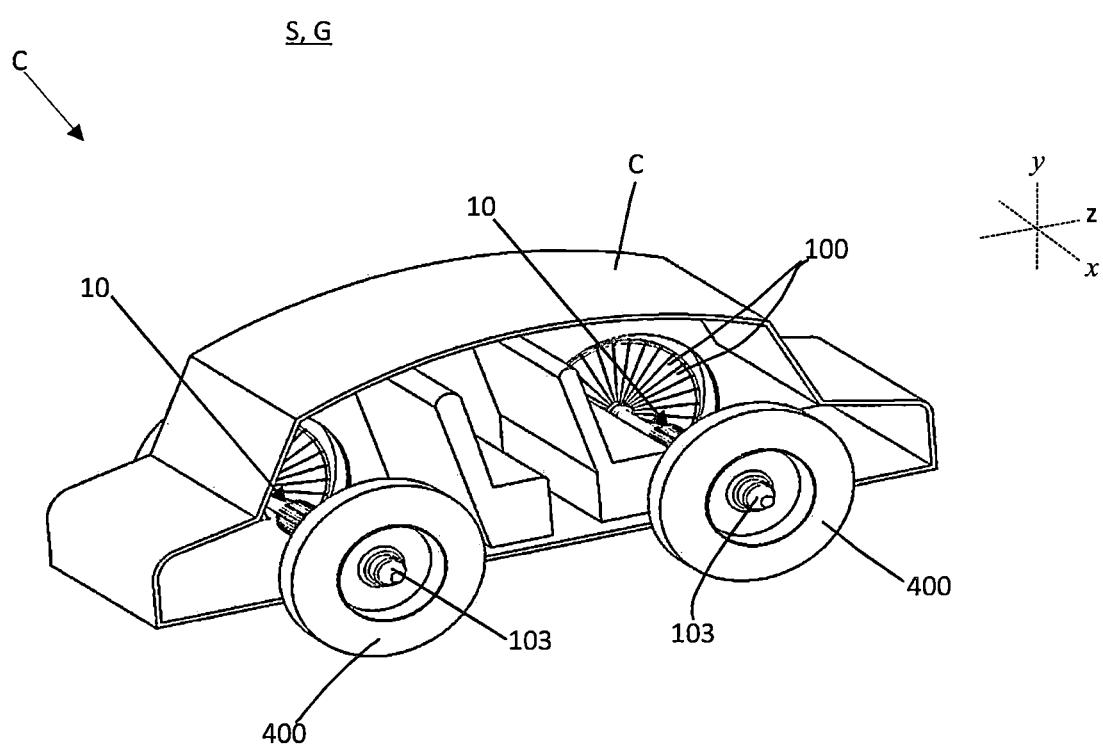
FIG. 10 shows a typical set up of the apparatus in a flying car that can also defy gravity.
Figure 11:
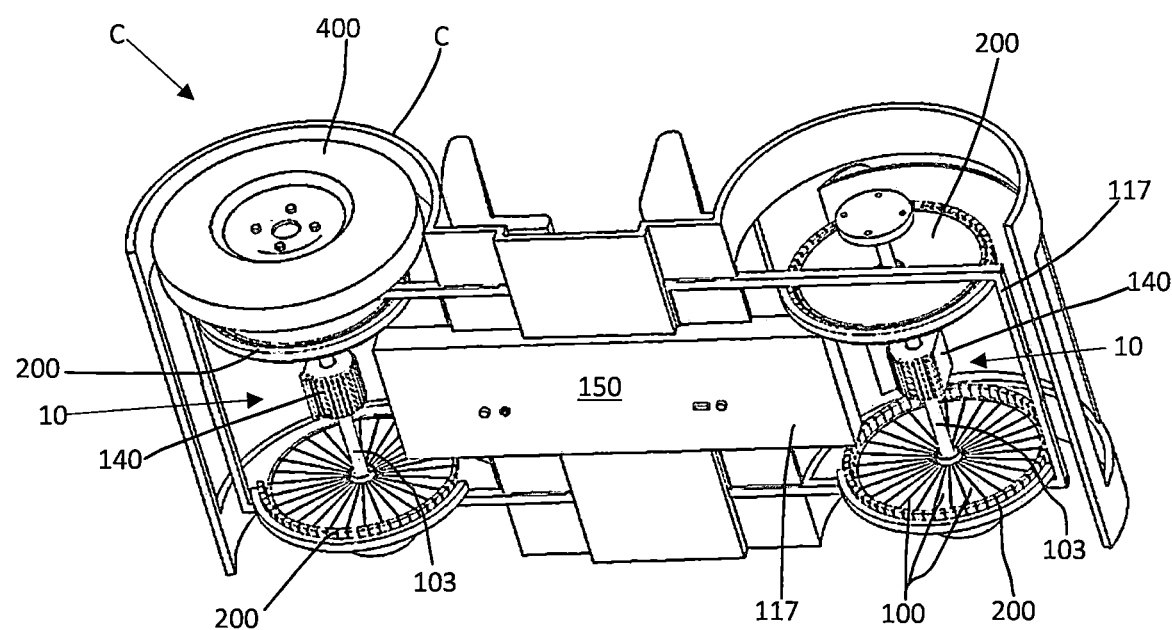
FIG. 11 shows how such a flying car can be built with wheels and battery pack.
Figure 12:
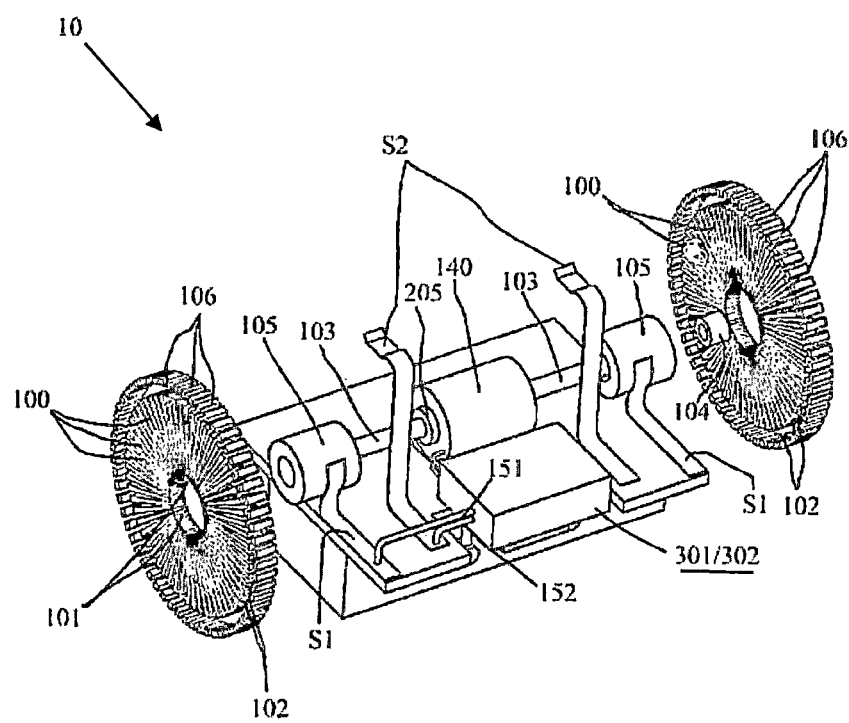
FIG. 12 show the typical configuration of a motor, the disk member, with spring contacts and sliding contacts, power source and controllers.
Figure 13:
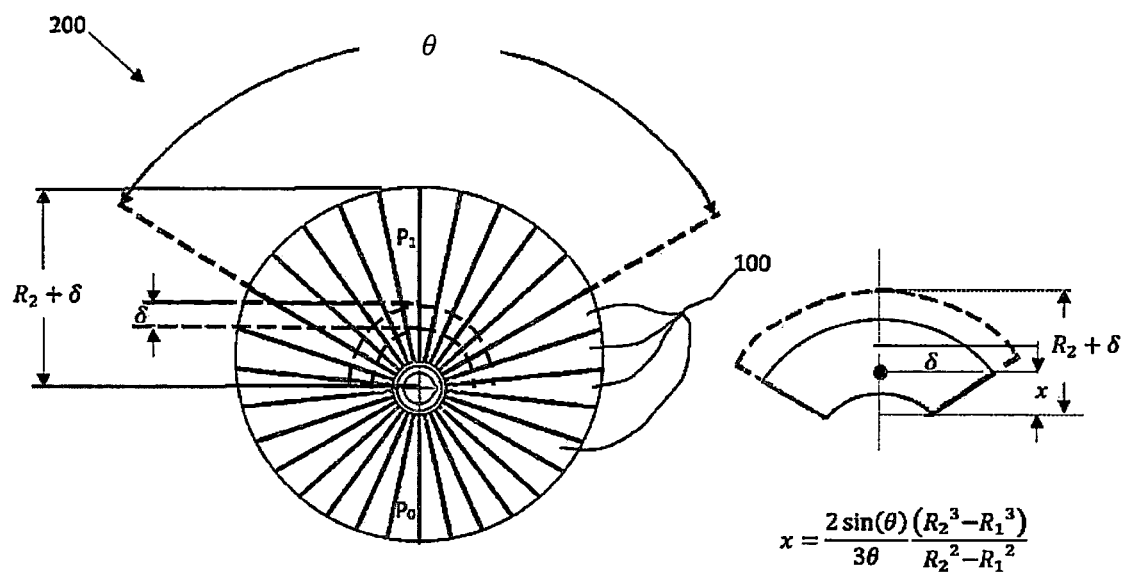
FIG. 13 shows the general relations of the disc members shape-shifting arc segments when actuated by an electric field with two sectors $P_o$ and $P_1$. $P_1$ is shown expanded to a larger radius than $P_o$, and the formular for the center of the mass of the annular sector $P_1$ is provided. The shift, $\delta$, of the annular centroid's center of mass is shown.
Figure 14:
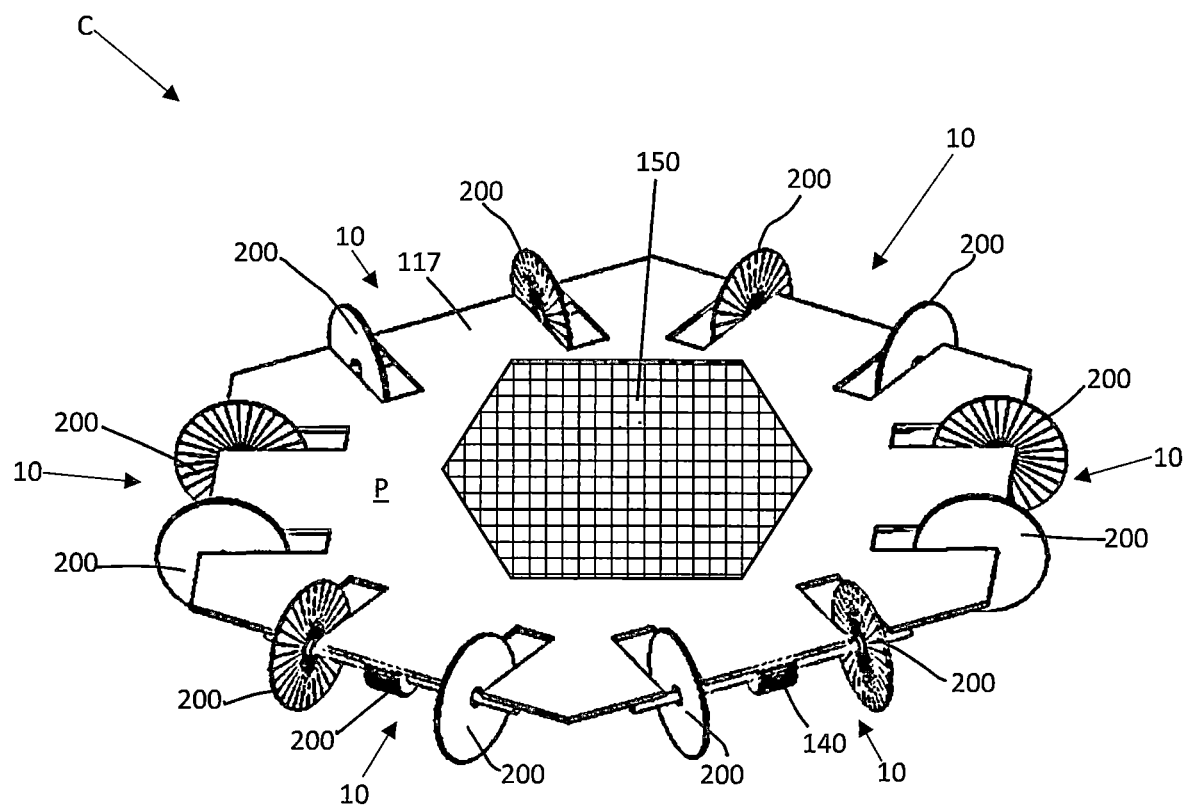
FIG. 14 shows how a spacecraft can be made with 4 pairs of dis members powered by a solar panel.
Figure 15:
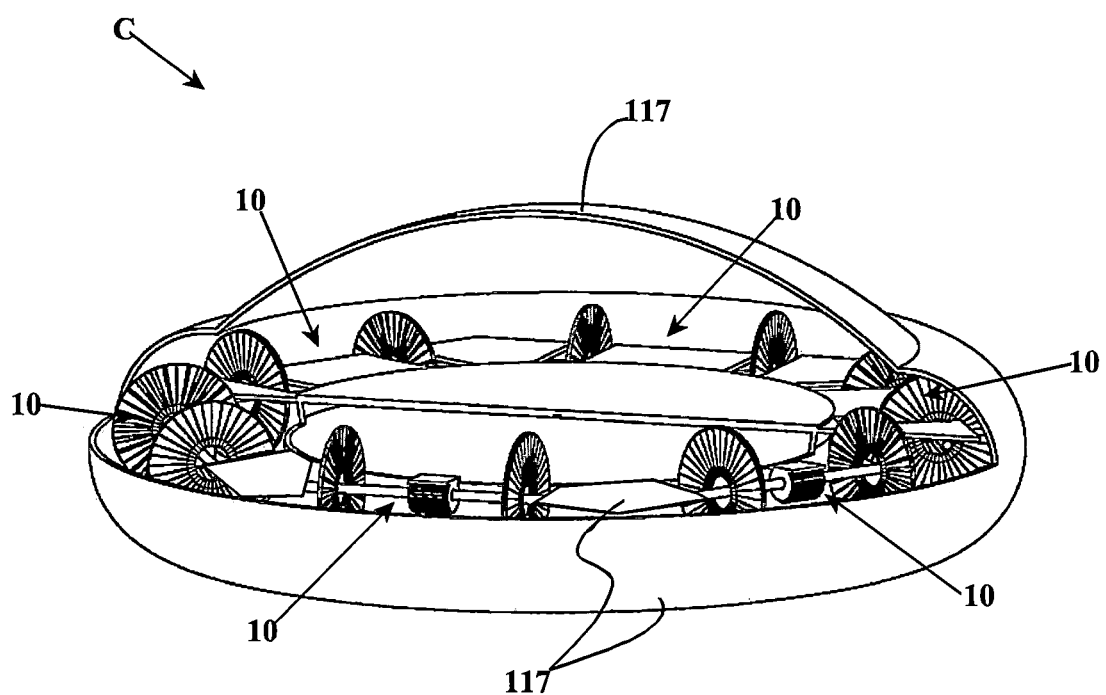
FIG. 15 shows the configuration of a spacecraft as per FIG. 14 that can be made to fly in any direction in space and rapidly change direction by orientation of the activated segments of a multi-disc member configuration.
Figure 16:
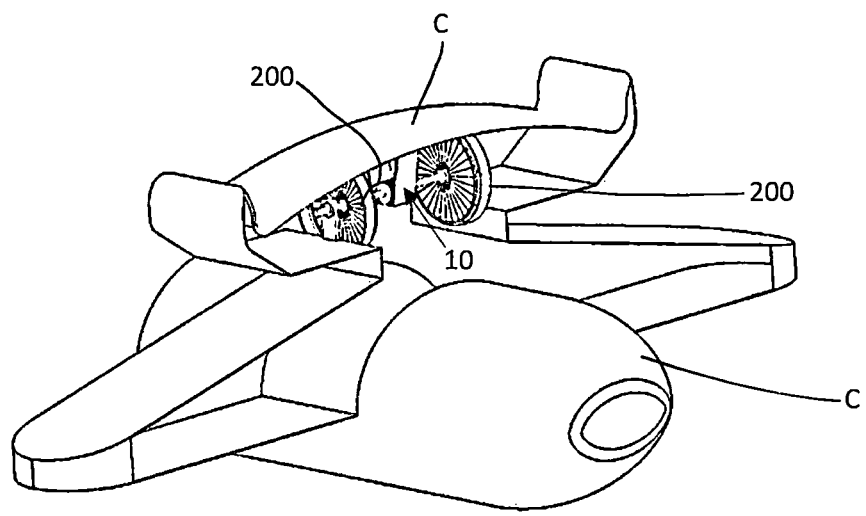
FIG. 16 shows an airplane using the apparatus as a propelling engine.
Figure 17:
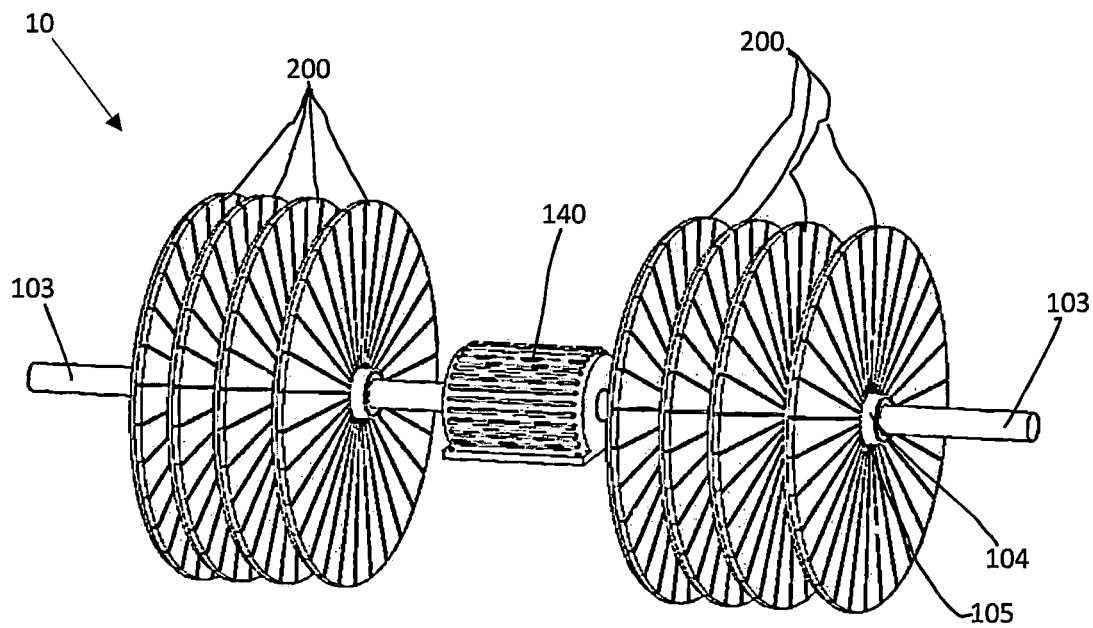
FIG. 17 shows a configuration in which multiple disc members are in parallel configuration for increasing the force generated by the apparatus.
Figure 18:
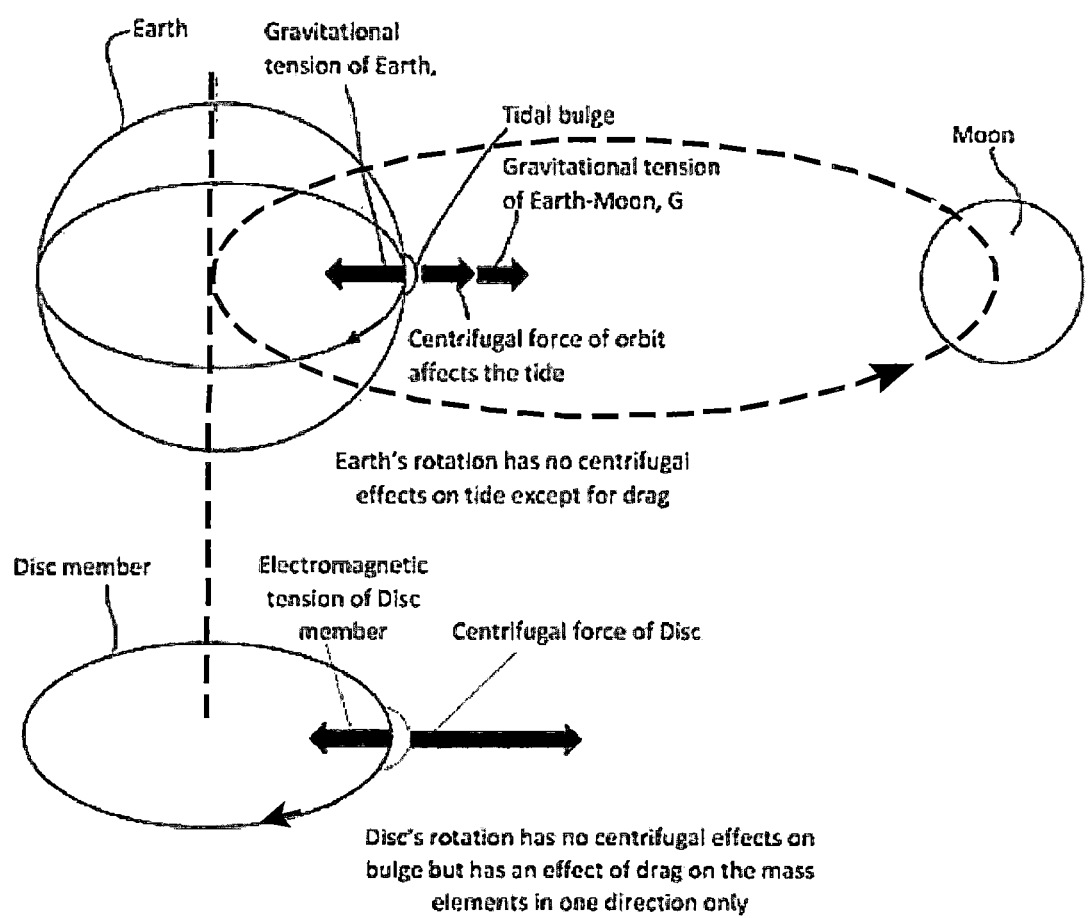
FIG. 18 shows a model of the apparatus as a tidal system such as an Earth-Moon system.
Figure 19:
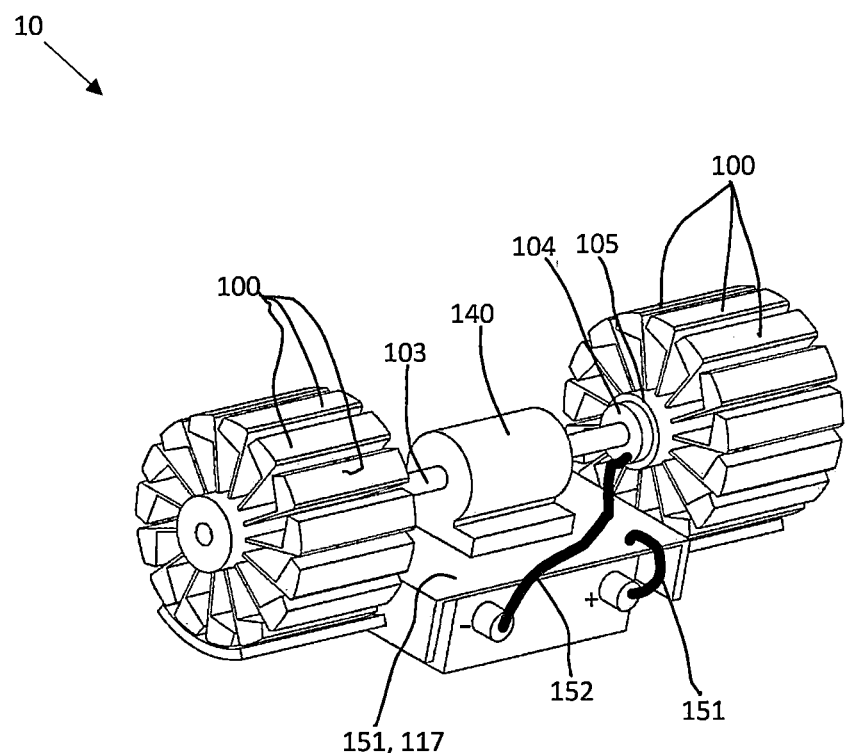
FIG. 19 shows a version of the disc member with slanted shape-shifting arc segments that can be activated to extend or contract at a slight angle to the tangent of rotation. This version can compensate for any rotational vectors caused by the arc segment's spread.
Figure 20:
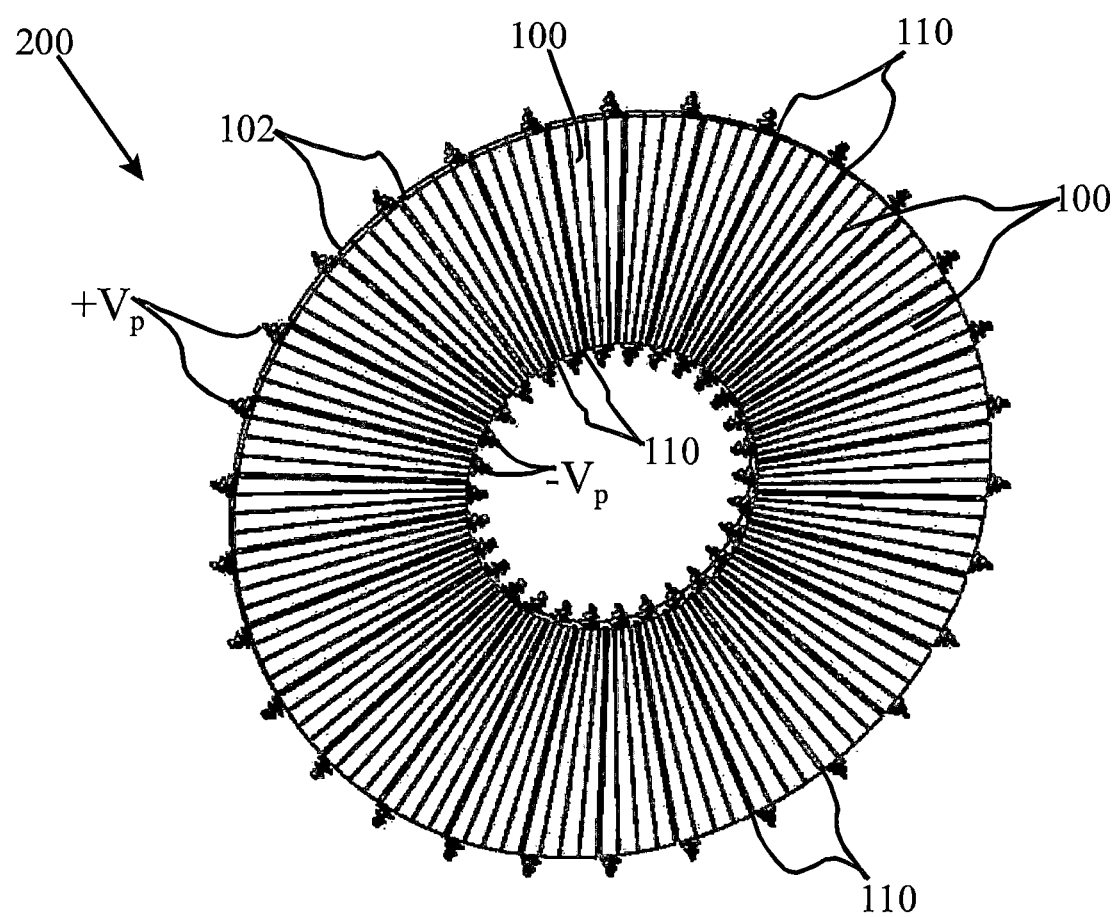
FIG. 20 shows the disk member made as a single piece from a piezoelectric material with poling in an array of radial directions. The arrows show the direction of the radial poling and the voltages +Vp and −Vp induced on the disk member to the outer segment activation contacts, and to the inner common contact faces, respectively. The poling direction can be reversed also.

In a gravitational field, the vehicle C, can be provided with wheels 400 that are attached to the shaft member 103 as shown in FIGS. 9 and 10. Advantageously, the apparatus 10 can be used as a propulsion means in a 3-D space such as on land, in the air, Space, and in the Ocean.

A shape-shifting arc segment 100 acts as an actuator that converts an electromagnetic field, E, to precisely controlled radial displacements (δ), of the shape-shifting arc segment 100. Compounds made from Poly(L-lactic acid) PLLA, Poly(vinylidene fluoride-co-trifluoroethylene) PVDF-TrFE, and Poly(vinylidene fluoride) PVDF, can be used to make the shape-shifting are segments 100 with a disc member 200 general disc member frame 201 made from a strong polymeric substrate such as PVC, polycarbonate, Kevlar, and other robust materials. Flexible boundary gap 110 separating each shape-shifting arc segments 100 from one another as independent actuators can be made from suitable elastomeric materials such as silicones, PVC and strong polyurethane foam materials. Boundary gap 110 can be replaced with a non-conducting plastic spring to keep the actuators separated. In another version, boundary gap 110 is filled by a conducting spring contact 107 as will be explained later. Advantageously, the shape-shifting arc segments 100 can also be made with the compounds doped with magnetic materials and also magnetically poled materials to provide for a magnetically actuated behavior.

The angular grid of isolated shape-shifting arc segments 100 can also be easily made by cutting the arc segments out of any desired shape-shifting material to tightly lit into boundary gap 110 as arc segment pockets on the disc member 200. The shape-shifting arc segments 100 can be cut to shape using micro-dicing saws typically used for slicing silicon wafers and then glued to a disc frame to between boundary gap 110s to form the disc member 200. Micro slicing can be used to precisely cut fragile materials into the shape-shifting arc segments 100 without fracturing their edges. For example, both ceramic based and sintered iron magnetic shape-shifting arc segments 100 can be made the same way.

Figure 2:
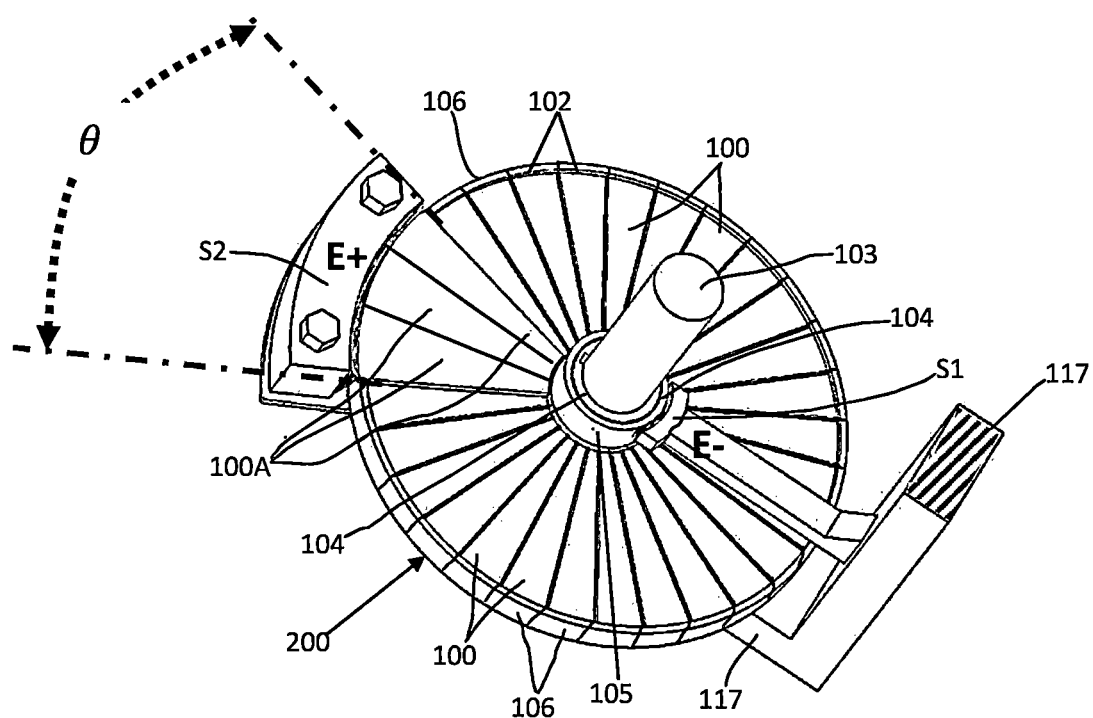
FIG. 2 shows the disc member subject to electromagnetic fields applied on brushes as rotating contacts.
Figure 3:
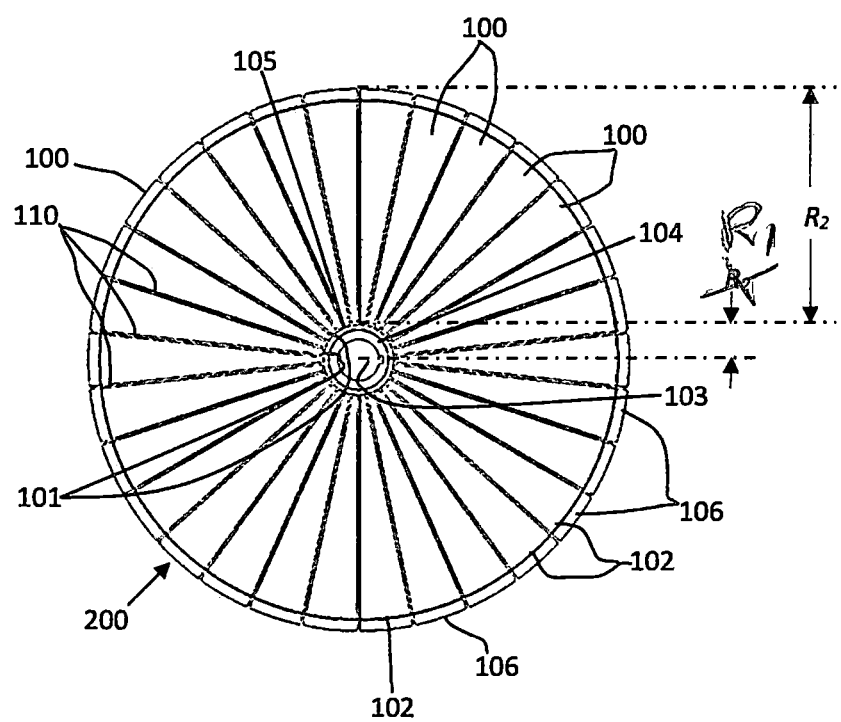
FIG. 3 shows the displacement of the radial mass distributions of the disc member.
Figure 4:
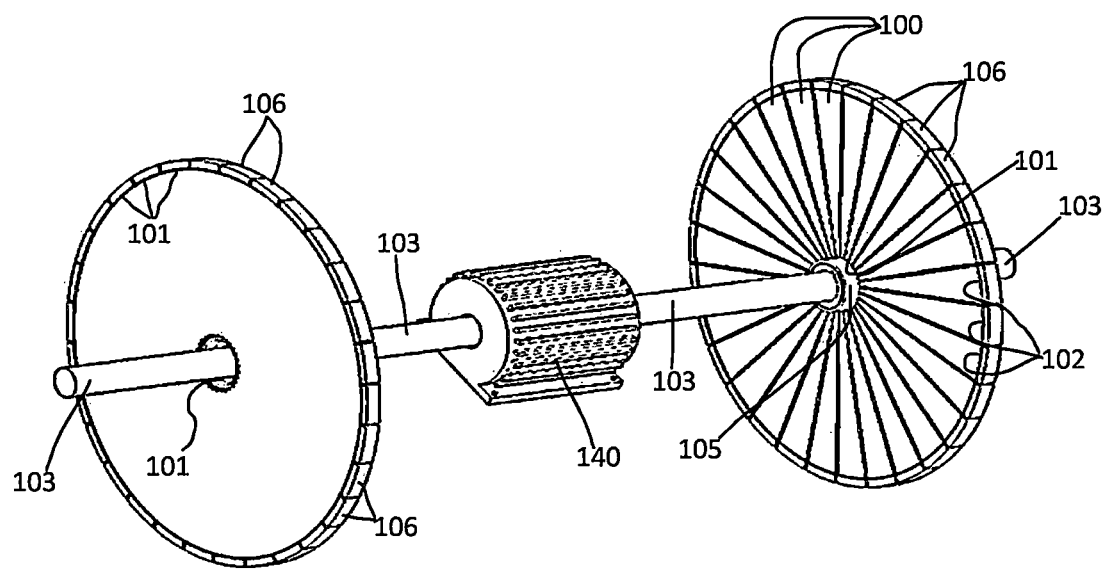
FIG. 4 shows the disc member with the encoded motor and shaft and details of the actuation faces of the shape shifting arc segments.
Figure 5:
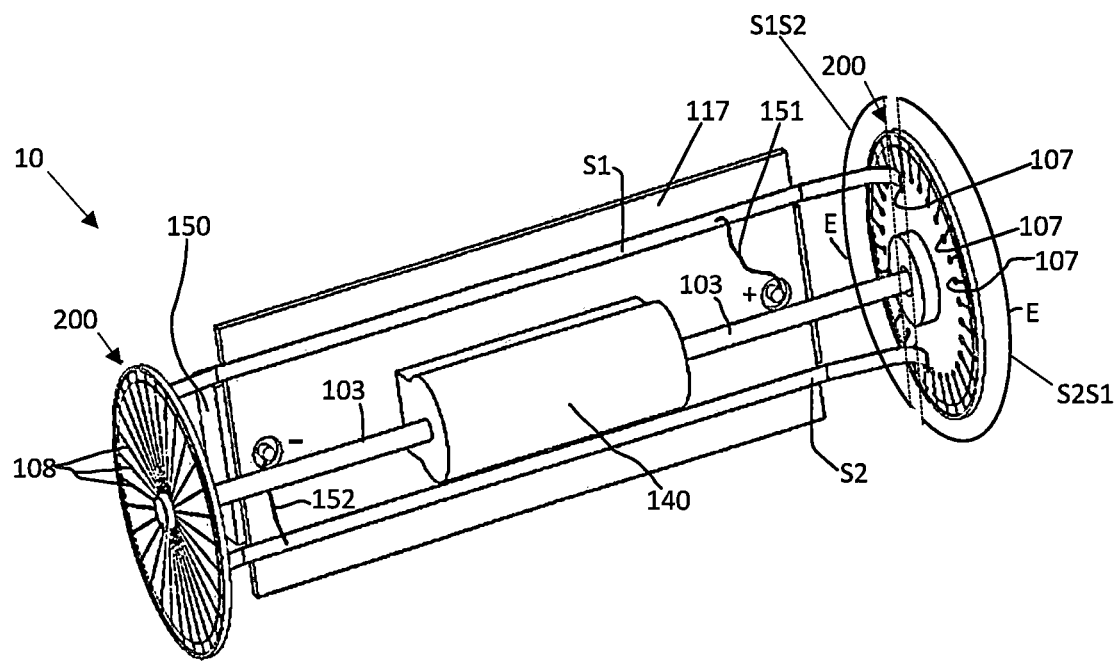
FIG. 5 shows a frame holding the apparatus elements and a battery power source radial edge actuated disc member.

As shown in FIGS. 2, 3 and 4 the shape-shifting arc segments 100 outer radius contact faces 102 are respectively each connected to individual electromagnetically conductive arc segment activation contacts 106. The arc segment activation contacts 106 are electromagnetically isolated from each other as much as possible. The arc segment activation contacts 106 are made from electromagnetically conductive material. The are segment activation contacts 106 can be attached to each the shape-shifting arc segment outer radius contact face 102, using either metallized coatings or a conductive glue, such as a silver paste glue. Silver pastes need very low heat to fuse electromagnetically conducting members to the shape-shifting arc segments 100.

Advantageously, the disc member 200 when formed, is a uniform annular and circular disc made with an array of shape-shifting arc segments 100, forming a symmetric radial array. A common activation contact ring 105 connects all the shape-shifting arc segments 100, and each shape-shifting arc segments 100 has an arc segment activation face 106. The shape-shifting material common activation contact ring 105 is a rotating contact ring for transmitting electromagnetic signals, E, of a given polarity to all the shape-shifting arc segments 100. The arc segment activation contacts 106 form a segmented circular array that smoothly defines a second rotating contact for transmitting electromagnetic signals, –E, of an opposite polarity to selected shape-shifting arc segments 100 for each disc member 200. The arc segment activation contacts 106 can be made to be as massive as possible to provide for the maximum centripetal forces possible.

Thus, each disc member 200 has a multiplicity of small arc segments comprising individual shape-shifting arc segments 100 that can be activated individually and respectively, with an electromagnetic signal, with one signal polarity applied to the common activation contact ring 105, and the opposite signal polarity applied to any desired number of arc segment activation contacts 106, respectively.

Preferably, the disc member 200, when formed, has a thickness that can be chosen to determine the mass, M, of the disc member 200. The disc member 200 can also be considered as a cylinder. Other dimensional configurations may be selected without changing the basic aims of the invention. There are other ways to make the disc member 200.

For example, a shape-shifting material may be used to form a disc member 200 in one piece, and still have independent shape-shifting arc segments 100 also formed in it. As mentioned before, this can be done by using various sintered ceramic-based and polymer-based shape-shifting materials of different properties and press-forming the disc member 200 as one piece with shape-shifting arc segments 100 separated by non-conductive material zones. Combinations of molded polycrystalline piezoelectric materials, doped magnetic polymers, and sintered and doped piezoelectric ceramics may also be used to achieve the same. There are other ways to form the shape-shifting arc segments 100 in a disc member 200. For example, they can be 3-D printed into the desired shape and constitution with the insulating separations, using multi-core printing technics. Vapor deposition can also be used to form the shape-shifting arc segments 100. As another example, they can be made as a multiply-stacked and electromagnetically connected shape-shifting material sections that all act to provide for a larger stroke, δ, when actuated by an electromagnetic field, E.

The disc members 200 can also be formed by thermal spraying thermoplastic components with various concentrations of shape-shifting materials into the desired shapes that form separated shape-shifting arc segments 100. In other words, if piezoelectric materials are used, the shape-shifting are segments 100 can be made in conventional ways of stacking them to conform to the shape-shifting arc segments 100 shapes.

Finally, the entire disc member 200 can also be made from a single shape-shifting material without separations into individual shape-shifting arc segments 100. The disc member 200 can be made by a sintering process and then "poled" to cause a multitude of radially directed maximal poling voltages that have little or no poling at the boundary gap 110 of the shape-shifting arc segments 100. This can be done by electrically stressing the materials in defined radial directions only, in very much the same way that a multipole magnetic disc is magnetized by induction to generate bounded magnetic fields.

Preferably, the disc member 200 has shape-shifting arc segments 100 that are poled in a symmetric array of radial directions to form a uniform array to generate maximum stroke, δ, of the material in the poled directions only. The radial poling can be performed on shape-shifting arc segments 100 in a uniform ceramic disc member 200, for example. If made as a single unit, the material forming the shape-shifting arc segments 100 of the disc member 200 is first heated to the Curie point to allow the molecules to move freely. A strong poling electromagnetic field, $V_p$, is then applied in a multitude of radial directions radiating from a central hub to the perimeter for each span of a desired shape-shifting arc segments 100, to force all of the dipoles in the shape-shifting arc segments 100's material to line up in an array of finely graded section forming a radially "poled crystal". When the poling electromagnetic field, $V_p$, is removed, the dipoles of the material are locked in the radial array configuration and become permanently polarized in the radial directions.

The common activation contact ring 105 of all the shape-shifting arc segments 100 in a disc member 200, serves as a common contact for an electromagnetic field, E. However, nothing prevents the shaft member 103 from directly making contact with the shape-shifting arc segments 100 and acting as a common terminal for all shape-shifting arc segments 100. Arc segment activation contacts 106 can then be placed at the outer perimeter of the disc member 200 where the maximum poling electromagnetic fields, $V_p$, have been directed to contact each of the shape-shifting arc segments 100 respectively as independent contacts. The shape-shifting arc segments 100 are separated from one another by an electrically non-conductive thin boundary gap 110, made from a strong flexible non-conductive polymer. This prevents one shape-shifting arc segments 100 from affecting the other when electromagnetic field, E, is applied to it. The shape-shifting arc segments 100, form an annular disc with shape-shifting arc segments 100 inner radius contact face 101 of radius, $R_1$, and with shape-shifting arc segments 100 outer radius contact face 102 of radius, $R_2$. The shape-shifting arc segments 100 inner radius contact faces 101 connect conductively to a concentric cylindrical common activation contact ring 105. The common activation contact ring 202 can be welded unto the shape-shifting arc segment inner radius contact face 101 using either metallized coatings or a conductive glue, such as a silver paste soldering. Silver pastes need very low heat to fuse the common activation contact ring 105 to the shape-shifting arc segments 100. The common activation contact ring 105 is non-conductively coupled to the shaft member 103 with an insulating cylindrical sleeve 104, to prevent any applied electromagnetic fields, E to the common activation contact ring 105, from being conducted to the shaft member 103. The insulating cylindrical sleeve 104 mechanically rotates with the common activation contact ring 105 that is welded unto the shape-shifting arc segment inner radius contact faces 101 and so the entire disc member 200 rotates with shaft member 103.

It is important to note that if a magnetic fluid material is used for the shape-shifting arc segments 100, then, the arc segment activation contacts 106 can be made to absorb and transmit magnetic fields instead of electric fields, or electromagnetic fields. The entire invention is to build an apparatus 10 that shape-shifts with electro and magnetic currents. The objective can be achieved using shape-shifting materials as defined earlier, that respond to electromagnetic fields and either to contract radially, or to expand radially in selected shape-shifting arc segments 100.

The shape-shifting arc segments 100 can be made in several stacked annular arc layers that radially increase in radial arc to form a multi-stacked arc segment actuator in the radial directions, when actuated by electromagnetic fields. I have described the use of ceramic materials and polymers to create such shape-shifting arc segments 100. In the case of magnetic shape-shifting arc segments 100, one can use a stack of thin magnetically charged material layers that repel each other and when a magnetic field is imparted on a shape-shifting arc segments 100, it will radially contract or expand depending on the magnetic field strength of the applied magnetic field and the magnetic field strength used to polarize the shape-shifting arc segments 100.

Thus, each disc member 200 may be also constructed as a stack of a multiplicity of small arc segments, comprising an individual shape-shifting arc segments 100 that can be activated individually and respectively, with a voltage, or a magnetic field, depending on its make-up. This is done when a field of one pole applied to the common activation contact ring 105, and a field of opposite pole applied to any desired number of arc segment activation contacts 106, respectively.

Each disc member 200 has a multiplicity of shape-shifting arc segments 100, with a common activation contact ring 105 and independent arc segment activation contacts 106, to form a dynamically and statically balanced radial array around the shaft member 103.

As stated earlier, several shaft members 103 can be arrayed symmetrically to form a multi-disc member apparatus 10.

Preferably, the activated shape-shifting arc segments 100 portions of a disc members 200 point in the same direction. The differences in the actuation energy and centripetal forces in two opposite radial directions of each disc member 200, generates a reactive force, F, on that disc member 200 that makes the apparatus 10 exert a net propulsive force, F, of motion in a preferred radial direction of their rotational planes on the shape-shifting arc segment 100 that are actuated by an electromagnetic field, E. Rapid changes in electromagnetic energy, E, applied to the shape-shifting arc segments 100 in a preferred angular radial direction θ, of the rotating disc member 200 results in small radial changes in their shapes in the preferred angular direction θ, changing their symmetry and static and dynamic balance in that direction only, while leaving the disc member 200 perfectly balanced in its rotational state. This shape-shift is imposed only on a preferred angular span of the disc members 200 on the shape-shifting arc segments 100 that comes to the given preferred angular direction that has the applied electromagnetic field present in the rotation planes. Thus, the more disc members 200 present, the greater the directional force, F, that can be generated by the apparatus 10. It is important to note that the angular orientation direction θ, of each activated shape-shifting arc segment 100 of each disc member 200 can be oriented in a desired direction that imparts a desired overall motion to the apparatus 10. For example, all the activated shape-shifting arc segments 100 may be oriented vertically to force the vehicle C, into that motion only. Other directional vector orientations for the shape-shifting arc segments 100 may be chosen for the desired steering of a vehicle C, comprising the apparatus 10.

While the rotation of the disc members 200 is sustained by one or more electric encoded motors 140 powered by a power source 150, such as batteries, and other sources such as solar panels, both disc members 200 become asymmetrically unbalanced radially, in only a preferred angular orientation direction θ, of the applied field, E, during rotation, and they generate either a preferred bulge, or a preferred contraction of the shape-shifting arc segments 100 in that angular radial angular orientation direction θ, only, while the remainder of the disc members 200' bodies remain essentially the same disc shape as without the applied electromagnetic field, E.

The disc member 200 "shape-shift" to generate a propulsive force, F, in the radial direction, θ, of the shape-shifting arc segments 100 that have been actuated.

It is important to note that the shape-shifting of the shape-shifting arc segments 100 is not a rotating component just as the sea tide is not a rotating component in the model mentioned above. It is a topological shift of the disc member 200 in a preferred direction of Space S, in its symmetry. The shift is time independent during rotation relative to the fixed angular disposition of the applied field, E, on the preferred shape-shifting arc segments 100. The topological shape-shift of the shape-shifting are segments 100 of the disc member 200 does not rotate but only causes a shift of the shape-shifting arc segments 100 in a radial direction. θ, for the activated shape-shifting arc segments 100. For example, if the topological shape shift were to rotate, it will generate an imbalance that will be transmitted to the shaft member 103 as an unbalanced system. Similarly, a tide that rotates with the earth will only be present in the same orientation as the applied gravitational field of the moon at all times, and that is not the case, then the earth will wobble about a fictitious center of gravity.

The disc members 200 must be symmetrically, statically, and dynamically balanced prior to application of the applied electromagnetic field. The disc members 200 can have any symmetrical, statically and dynamically balanced shape, whatsoever, without the applied field. Preferably, the disc member 200's shape-shifting arc segments 100 form circular and annular discs of a given thickness and are mounted to the shaft member 103 at axially opposite and symmetric locations.

The changes in centripetal forces in the direction of the applied electromagnetic fields to preferred shape-shifting arc segments 100, cause changes in the shapes of the disc members 200 and results in a reactive directed radial change of forces in those portions. The un-activated shape-shifting arc segments 100 remain circular and unchanged. Hence, changes in the static and dynamic balance occur only in the radial directions and the symmetry of the disc member 200 in all its rotational elements is maintained.

The changes in symmetry of the disc members 200 cause an offset in centripetal force differences F, between the actuated shape-shifting arc segments 100 and the unactuated shape-shifting arc segments 100 of the disc members 200, respectively. This results in a net action and reaction between the radial direction θ, pointing to the rotational axis and the away from the rotational axis. The momentum of the disc members 200 is unbalanced in the radial direction of the applied electromagnetic field, E, on the shape-shifting are segments 100 at all times. This transfers energy from the encoded motor 140 to the shape-shifting arc segments 100 in addition to the applied electromagnetic field E's energy. Since the disc members 200's weight does not change, they remain dynamically balanced as rotating objects. However, a real force, F, arises that has a directional quality that is not rotational in nature. This force F, does not make the disc members 200 go into a state of dynamic imbalance. It is a directional force in the radial direction θ, of a particular span of the shape-shifting arc segments 100. One can image that gravity is such a force that is directional on a rotating vertical disc but does not affect the rotational balance of the rotating disc. If less than half of the mass a disc member 200 is disturbed by the applied electromagnetic field, E. and most of the mass of the disc member 200 is the unaffected portion left unchanged by the applied electromagnetic field, E, then, due to the equal momentum principle, the angular speed, (A, of the unreacted part, $P_0$, will be always be the same as the angular speed of the actuated part, $P_1$, and the balance of forces on the disc member 200 only cause the reactive portion to move at a faster or slower tangential velocity, $v=R_2\omega$, than the unreacted portion, resulting in the appearance of a net centrifugal force differences, F, in the radial direction, θ.

In all embodiments of the invention, the apparatus 10 consists of a frame member 117 with bearing seats 118 to a pair of bearings 205, and to hold an encoded motor 140 with a pair of bearings. Advantageously, the encoded motor bearings 205 can also serve to hold the shaft member 103 without the need for extra bearings 205. Advantageously, the frame 117 can also serve as a vehicle C.

When assembled, the frame 117 will hold the encoded motors 140, and any bearings 205 that hold the shaft members 103 (and thus the disc members 200 to rotate about its central axis of symmetry).

The shape-shifting arc segment 100 act as actuators that produce small displacements with a high force capability when an electromagnetic fields, E, is applied.

For example, many thin shape-shifting ceramic made as piezoelectric crystals, can be electrically bonded in parallel to provide for an accumulated displacement that can be very large. Piezo Electric Fuel Injectors (PZO), are commonly used in gas and diesel engine engines to rapidly open and close fuel injectors using a pulsed voltage. For example, a 35 mm stacked height of piezoelectric crystal discs (diameter determines the total force) can produce a stroke, δ, of about 45 microns. This small stroke δ, is enough to make them act as electronic fuel injector actuators. Therefore, a larger stack of about 500 units with a stroke of 100 μm can provide a stroke of δ=5 cm. The example is only to show that the stroke, δ, can be increased significantly with advances in the technology.

The apparatus 10 further comprises a common leaf contact brush S1, attached to the frame member 117 for slidingly, and conductively contacting and transmitting a voltage of a given polarity to the common activation contact ring 105. The apparatus 10 further consists of one or more segment terminal contact leaf spring S2, attached to the frame member 117 to selectively activate shape-shifting arc segments 100 in some angular span, say, θ, where the angle, θ, is measured from the vertical y-axis of symmetry and centered through the x-axis of the rotation. The common leaf contact brush S1 is connected by a lead wire 151 to one polarity of the power source 150's output terminal, and the segment terminal contact leaf spring S2 is also connected by a lead wire 152 to the opposite polarity of the power source 150's output terminal, Advantageously, the shape-shifting arc segments 100 can also be made in the form a circumferential array of peripheral actuators along the perimeter of the disc member 200 as shown in FIGURES. Therefore, the circumferential mass distribution of the disc member 200 can be changed by increasing or decreasing the circumferential density of the disc member 200 when a particular arc segment is extended or contracted. Extending and contracting an arc segment arc length will cause the radial distribution of matter to change and results in the desired changes in centrifugal forces generated on the disc member 200. In essence, the first and the disc member 200 performs the same function as that of a radial redistribution of mass of the disc member 200 in a selected set of shape-shifting are segments 100.

Figure 6:
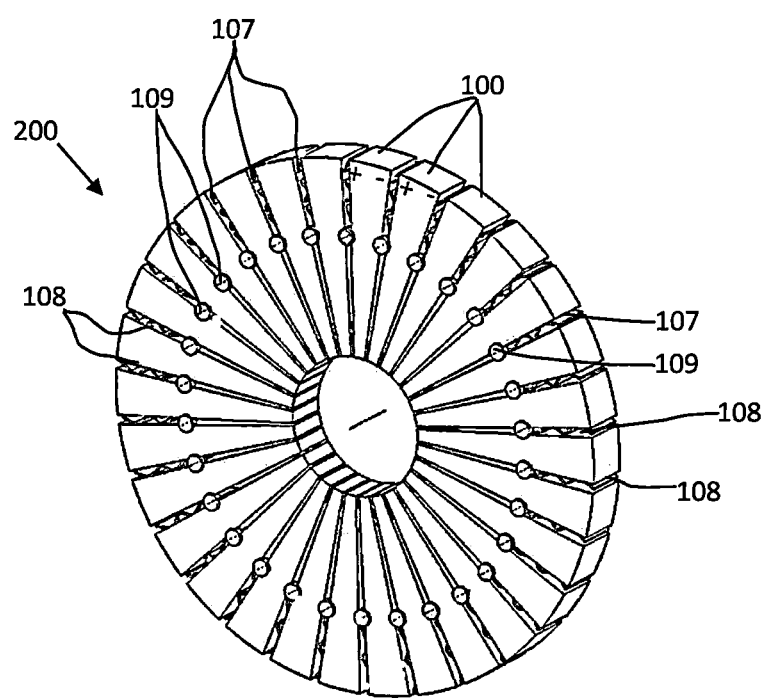
FIG. 6 shows the radial edge actuated disc member with spring terminals between them.
Figure 7:
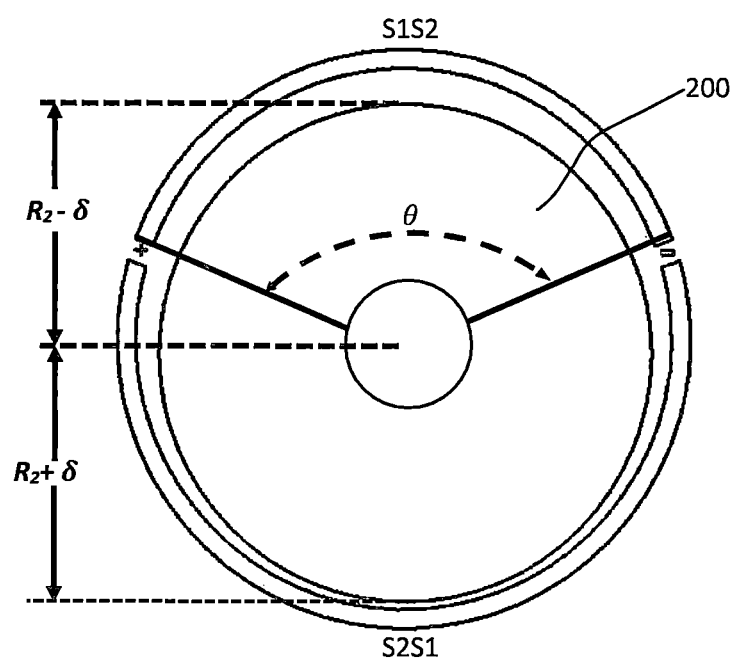
FIG. 7 shows the actuated angular segments of a disc member showing the reduction in radius of the sector S1S2 and the increase in radius of the sector S2S1 of a radial edge actuated disc member.

It is further advantageous that each of the radial array of shape-shifting arc segments 100 can be stacked together by making contact with one another along their shape-shifting arc segments radial edges 108 to form a continuous circumferential array as shown in FIG. 7. In this case the array of shape-shifting arc segments 100 must be activated on the shape-shifting arc segments radial edges 108 to either expand and increase their angular dimension, thus increasing the disc member diameter, or contract and decrease their angular dimension, thus decreasing the disc member diameter. This form of the apparatus 10 has the advantage of simplicity. Each shape-shifting arc segments 100 is provided with a spring contact 107 with a slide terminal contact 109 on its shape-shifting arc segments radial edge 108 that connects to another consecutive shape-shifting arc segments radial edges 108 forming a continuous circumferentially stacked array. In this case the shape-shifting arc segments 100 must be poled on the shape-shifting arc segments radial edges 108 and stacked as connected positive and negative poled transducers in the manner of a battery pack. A common activation terminal 107 ties to each such contact point of two consecutive shape-shifting arc segments radial edges 108. This provides for a unique way to utilize all the circumferential stack of shape-shifting arc segments 100 as actuators that form a continuous circular stack to perform work. This is similar to a battery pack that can be tapped off at any number of batteries in a stack. Imagine circumferential array of batteries with each positive contacting a negative terminal in the circular array. For example, each shape-shifting arc segments radial edges 108 of each of the shape-shifting arc segments 100 terminating in a positive poled surface is connected to the negative poled surface of the next shape-shifting arc segments radial edges 108 in closed circular sequence by a spring contact 107. Thus, by connecting any slide terminals 109, respectively to leaf spring contact S1 and leaf spring contact S2 with opposite polarities respectively, one sector S1S2 of the disc member 200 will have contracted shape-shifting arc segments 100, while the other sector S2S1 will have expanded shape-shifting arc segments 100. The spring contacts 107 will allow expansion of the stacks as shown in FIGS. 6 and 7. This increases the cumulative centripetal force differences generated by a contracted segment sector S1S2 of the disc member 200's and the expanded segment sector S2S1 of the disc member 200.

Suppose a disc member 200 has a total of $2\pi$ radians of shape-shifting arc segments 100 (filling the circle). Let the axis of rotation of the shaft member be in the X-direction and let the rotational plane of the disc member 200 be the [y,X] planes.

Let the total mass of the disc member 200 be equal to T (kg).

Let the segment terminal contact leaf spring S2, and the common leaf contact brush S1 slidingly and conductively contact and transmit an electromagnetic voltage difference, V, on symmetrically located shape-shifting arc segments 100 in some angular span, $\theta$, that is subtended symmetrically about the vertical Y-axis of the rotations, in each of the disc members 200's rotational plane in the upper [y,z] planes above the x-axis.

Let this cause an extension $(R_2+\delta)$ of the outer radius, $R_2$, of the shape-shifting arc segments 100 in the angular span, $\theta$.

Then, the mass, M, of the extended segment of shape-shifting arc segments 100 of the disc member 200, is equal to $M=T/2\pi\theta$.

Therefore, only the shape-shifting arc segments 100 extended by the applied voltage of the segment terminal contact leaf spring S2 in the upper [y,z] plane.

When such a field, E, is applied, it will activate all the shape-shifting arc segments 100 that arrive at any given time period in the arc segments, $\theta$, in the upper [y,z] plane, as they make contact with the segment terminal contact leaf spring 206, and advantageously extend them by the stroke, $\delta$.

The shape-shifting arc segments 100 that are present in the arc segment, $\theta$, in the will extend symmetrically and dynamically, and change the shape of the disc member 200 from a perfect circle to a symmetric bulge about they-axis spanning $\theta$, in the upper [y,z] plane. This bulge is superimposed on the disc member 200 in a preferred direction, $\theta$. This slight change in mass distribution of the disc member 200 in the arc segment, $\theta$, will cause an imbalance of centripetal forces, F, on the disc members 200 in the direction $\theta$. This angular imbalance in density distribution results in a change in centripetal forces and results in the force F, appearing in the plane upper [x,y] plane. This force F, tends to generate a moment to rotate the shaft member 103 of the apparatus 10 in upper [x,y] plane of the apparatus 10.

To counter this rotation, the apparatus 10 must have at least two-disc members 200, symmetrically placed on the x-axis as stated above, to generate equal and opposite forces that balance with equal and opposite momenta to stop the rotation of the apparatus 10, in the x-direction only, as shown in FIGS. 1-15.

One can imagine that the centripetal forces will tend act in they-direction, and will tend to rotate the shaft member 103, and encoded motor 140 in the [x,y] plane since they create a moment about the axis of rotation of the apparatus 10. When two-disc members 200 are used, and they are symmetrically placed equidistant on the x-axis of rotation, this gives a total force of 2F, in the same y-direction, and this removes the imbalance. Thus, the rotations caused by the forces, F, can be converted to a net vertical force, 2F in the vertical y-direction, only. It is preferable that the encoded motor shaft member 103 extends equally in two directions along the axis of rotational symmetry to allow two-disc members 200 to be positioned on opposite sides of the encoded motor 140 to counterbalance each other.

If the rotation is uniform of angular speed, $\omega$, then, the reactive difference in centripetal force, 2F generated by the actuated shape-shifting arc segments 100, in the upper [y,z] planes, depends on its angular extent, $\theta$ and the stroke, $\delta$.

Let the mass, T, of the uniform disc be evenly distributed on the disc members 200 and let the shape-shifting are segments 100 have an inner radius $R_1$ and outer radius $R_2$. The mass, M, of the activated shape-shifting arc segments 100 is given by:

$$M = T\left(\frac{\theta}{2\pi}\right)$$

The centroid, r, of an arc segment of angular extent, θ, of inner radius $R_1$ and outer radius $R_2$ is given by:

$$r = \frac{2\sin(\theta)}{3\theta} \frac{(R_2^3 - R_1^3)}{R_2^2 - R_1^2}$$

The shift in centroids is given by:

$$\delta = \frac{2\sin(\theta)}{3\theta} \frac{((R_2 + \delta)^3 - R_1^3)}{(R_2 + \delta)^2 - R_1^2} - \frac{2\sin(\theta)}{3\theta} \frac{(R_2^3 - R_1^3)}{R_2^2 - R_1^2}$$

Let the force generated by the centripetal force difference be $F_c$, and let the reactive force imposed on the shaft member 103 by given by $F_R$, and let the force of activation due to the electromagnetic field be $F_E$. The differences in centripetal forces, F, due to the encoded motor 140 acting on the centroids of arc segments, θ, of shape-shifting arc segments 100 of mass, M that arrive at any given time period in the arc segments, θ in the upper [y,z] plane, and the uniform unexpanded arc segments of the same are measure is given by the differences in the shift of the centroid, δ, for the centripetal forces acting on the centroid for each disc member:

$$F =$$

$$F_c + F_E - F_R = T\left(\frac{\theta}{2\pi}\right)\omega^2\left(\frac{2\sin(\theta)}{3\theta} \frac{((R_2 + \delta)^3 - R_1^3)}{(R_2 + \delta)^2 - R_1^2} - \frac{2\sin(\theta)}{3\theta} \frac{(R_2^3 - R_1^3)}{R_2^2 - R_1^2}\right)$$

Since the encoded motor 140 can have energy that is greater than the activation reactive for N, and the force applies to both shaft member and the shape-shifting arc segment 100, we can assume the reactive force to be small compared to the centripetal forces, F.

The relation can be reduced to simple form as follows. There, are two scenarios:

a) The apparatus 10 as described is stable in the rotations that can be caused by the equal forces, 2F on the two-disc members 200. However, it is still unstable, and has a rotational force component about the axis of rotation of the shaft member 103, by the action and reaction principle. When the apparatus 10 is used with a vehicle C, in a gravitational field, this problem by be alleviated by using gravity to stabilize the vehicle C. To alleviate this problem, suppose the apparatus 10 is used to power a vehicle C, of mass, W Kg. W is the total weight of the apparatus 10 and the vehicle C. Then, in a gravitational field, the apparatus 10 can be stabilized by gravitational fields, if the center of mass of the vehicle C, is below the forces, 2F. In other words, the weight W will stabilize the vehicle C.

b) If the apparatus 10 is to lift the vehicle C, against gravity, then, the force, 2F, must be greater than some minimum value, equal to the net gravitational force, Wg, acting on the total vehicle C's weight, W, where g is the gravitational acceleration at the location of the vehicle C. A vehicle C, can be constructed that will have a net center of gravity below the forces, 2F, keeping the vehicle C is a steady orientation. (swinging below the lifting force, 2F). Obviously, the sway of the vehicle C, will be in the [y,z]-directions, and so the vehicle C's center of gravity can be made to off-set the tendency of the vehicle C, to sway. Then, for lift off against gravity to happen, the force F, in the vertical direction, υ, must balance the gravitational force on the total vehicle C's weight W, plus the weight of the disc member, and so must satisfy the centroid relation for the forces acting on the annular segment of the centroid:

$$T\left(\frac{\theta}{2\pi}\right)\omega^2\left(\frac{2\sin(\theta)}{3\theta} \frac{((R_2 + \delta)^3 - R_1^3)}{(R_2 + \delta)^2 - R_1^2} - \frac{2\sin(\theta)}{3\theta} \frac{(R_2^3 - R_1^3)}{R_2^2 - R_1^2}\right) = (W - T)g$$

Where, g is the gravitational acceleration of the earth (9.81 $ms^{-2}$), or in the case of a foreign planet that the vehicle C is in, the planet's g.

The gravitational field, G, and the net upward forces, will keep the vehicle C, from sway as they act on the vehicle C, to keep it moving in the direction of the lifting force, 2F. Think of this as lifting a mass tied to a string on a pivot above the mass. However, the sway is not eliminated by this arrangement of two disc members 200. The problem can also be eliminated by the following setup of the apparatus 10.

This relationship can be reduced to the general form.

$$W = T\left(\frac{\omega^2}{3\pi g}\sin(\theta)\left(\frac{((R_2 + \delta)^3 - R_1^3)}{(R_2 + \delta)^2 - R_1^2} - \frac{(R_2^3 - R_1^3)}{R_2^2 - R_1^2}\right) - 1\right)$$

It is clear that the relationship will yield positive values for W>0, if;

$$\frac{\omega^2}{3\pi g}\sin(\theta)\left(\frac{((R_2 + \delta)^3 - R_1^3)}{(R_2 + \delta)^2 - R_1^2} - \frac{(R_2^3 - R_1^3)}{R_2^2 - R_1^2}\right) > 1$$

TABLE 3 below shows a series of solutions for the net weight, W kg that can be lifted against gravity by the apparatus 10 with one disc member 200, if the parameters are chosen as show in the TABLE 2.

TABLE 2

| The following parameters were considered | | |
|---|---|---|
| Density of the disc member 200 | 8120 Kg/m$^3$ | Standard ceramic-based actuators |
| Thickness of the disc member 200 | 0.1 m | |
| g | 9.8 ms$^{-2}$ | |
| $R_1$ | 500 mm (2" shaft) | |
| $R_2$ | 1 m | |
| Ω | Revs/s | |
| δ | 5 cm | Based on stacked a 500 stack of 35 mm piezoelectric actuators producing 100 micrometers of stroke, similar to Piezo Electric Fuel Injectors (PZO) |
| θ | 0/1 radians, (5.73°) Angle of subtended actuation in radians | |
| T, (mass of a disc members 200) | 1913 Kg | |
| M, (mass of segment) | 30.45 Kg | |

TABLE 3

| θ radians | ω rps > |
|---|---|
| 0.1 | 144.0620285 |
| 0.2 | 102.1226506 |
| 0.3 | 83.73246990 |
| 0.4 | 72.94227276 |
| 0.5 | 65.73957778 |
| 0.6 | 60.57601798 |
| 0.7 | 56.71150476 |

It is clear that there are solutions for ω, that will cause lift-off for the parameters chosen in TABLE 2. The actual weight of a craft, C of total weight, W kg, that can be lifted, including passengers and power sources, for the parameters in TABLE 2 are a function of the angular speed, ω.

TABLE 3 below shows the amount of weight, W, in Kg that can be lifted at a particular angular speed by a disc member that is specified in TABLE 2 above.

In free Space S, the relationship of the planes [x,y][y,z] [x,z] are relative to the apparatus 10, shaft member 103, and have no bearing to the concept of vertical. As such one must define "vertical" as the y-axis, relative to an observer's frame of reference, O, as shown in FIG. 8. The tendency of the vehicle C, to rotate about the shaft member 103, can be eliminated by simply doubling the components of the apparatus 10, and providing for two parallel shaft members 103, two encoded motors 140, and four parallel disc member 200 held in platform, P as shown in FIG. 8.

In this case, the arrangement is doubled, with 4 parallel rotating disc members 200. Two of the disc members 200 are coupled to the same shaft member 103 as described earlier. Two other disc members 200 are coupled to another shaft member 103 to rotate in an opposite direction to counterbalance the shafts members 103's rotations.

The platform P, acts as the relative horizontal frame of reference of the observer, O. Then, there will be 4-directional force vectors 4F, on the platform acting in the same y-direction in a balanced mode as shown in FIG. 8. In this case, as in the above case, the vehicle C, can be steered by slightly changing the rotational speed of each of the paired disc members 200. The solutions for various subtended angles of for the activated shape-shifting arc segments 100 in TABLE 2, clearly show that the apparatus 10 can lift a vehicle C, with a weight W kg, against gravity. More so, the apparatus 10 will work more efficiently in a gravity-free Space S.

| Augular velocity, ω/s | Weigh lifted with 2- disc members 200 Kg |
|---|---|
| 145 | 49.989499 |
| 160 | 893.497305 |
| 175 | 1819.971304 |
| 190 | 2829.417515 |
| 205 | 1921.829521 |
| 430 | 5097.209528 |
| 435 | 6355.557538 |
| 250 | 7696.871538 |
| 265 | 9121.157544 |
| 280 | 10628.40956 |
| 295 | 12218.62956 |
| 310 | 13491.81757 |
| 325 | 15647.97358 |
| 340 | 17487.09734 |
| 355 | 19409.18960 |
| 370 | 21414.24960 |
| 345 | 73302.77762 |
| 400 | 75671.27362 |
| 115 | 27927.23763 |
| 130 | 30264.16963 |
| 145 | 12684.06965 |

While the invention has been described, disclosed, illustrated and shown in various terms or certain embodiments or modifications which it has assumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim as my invention:

1. An apparatus comprising: a cylindrical shaft member coupled to a motor with a motor frame; said shaft member mechanically coupled to a plurality of disc members with a first radius, to rotate in a dynamically and statically balanced state with said shaft member when said motor rotates;

a power source to supply power to said motor to rotate said shaft member with said disc members, each said disc member comprising an annular radial array of material segments extending radially to the radius, said material segments comprising ef a material that responds to electromagnetic fields to change shape radially on said disc member;

such that when power is supplied to rotate the motor, the motor rotates the disc members and when each such material segment rotates to an angular location of said shaft member relative to a fixed point on the motor frame, each said material segment being supplied with said electromagnetic field, and said material responds to said electromagnetic field to change its shape radially to a second radius different from the first radius, at said angular location;

and such that the mass of said material segment is redistributed radially at the second radius in said material segment in said angular location; and such that the difference in centripetal forces acting on said change in radial location from the first radius to the second radius at said angular location creates a radial force on said shaft member in the direction of the said angular location.

2. The apparatus of claim 1, wherein the material segment comprises a piezoelectric material.

3. The apparatus of claim 1, wherein said material segment compriases a piezoelectric actuator.

4. The apparatus of claim 1, wherein said material segment comprises an magnetic actuator.

5. The apparatus of claim 1, wherein said material segment comprises a electrostatic actuator.

6. The apparatus of claim 1, wherein the material segments are equally distributed around the disc members in a circular array.

7. The apparatus of claim 1, wherein the angular rate of rotation of said motor can be controlled by adjusting the flow of power from said power source to said motor.

8. The apparatus of claim 1 wherein several said disc members are mechanically coupled to said shaft member.

9. The apparatus of claim 1, wherein said material segment is formed of a magnetic material.

10. The apparatus of claim 1 that wherein said disc member is a round circular disc.

11. The apparatus of claim 1, that wherein said disc member is a symmetric geometric pattern distributed about a center of symmetry.

12. The apparatus of claim 1, wherein said disc member is poled in radial directions in a plurality of equal angle segments to act as directional piezoelectric actuators.

13. The apparatus of claim 1, wherein said disc member is poled in circumferential directions in a plurality of equal angle segments to act as directional piezoelectric actuators.

14. apparatus of claim 1, wherein said force can be used to propel a vehicle.

15. The apparatus of claim 1, comprising a plurality of the apparatus.

16. The apparatus of claim 2, comprising a plurality of the apparatus.

17. An apparatus comprising a plurality of cylindrical shaft members coupled to an equal number of motors with motor frames, each said shaft member being mechanically coupled to a pair of disc members each with first radius, to rotate in a dynamically and statically balanced state with said shaft members when said motors rotate;

a power source connected to supply power to each said motor to rotate said shaft member with said disc members, each said disc member comprising an annular radial array of material segments extending radially to the first radius said material segments comprising of a material that responds to electromagnetic fields to change shape radially on said disc member;

such that when power is supplied to rotate at least one of said motors, the at least one motor rotates the pair of disc members to which it is connected, and when each such material segment in each of said pair of disc members rotate to an angular location of the shaft member relative to a fixed point on the motor frame, and each said material segment is supplied with said electromagnetic field; and said material responds to said electromagnetic field to change its shape radially to a second radius different from the first radius, at said angular location;

and such that the mass of said material segment of each said such disc member is redistributed radially at the second radius in said material segment in said angular location; and such that the difference in centripetal forces acting on said change in radial location from the first radius to the second radius at said angular location creates a radial force on each of said shaft members in the direction of the said angular location.

18. The apparatus of claim 17, additionally comprising a vehicle to which said shaft member is drivably connected.

19. The apparatus of claim 17, additionally comprising a vehicle having a steering mechanism to which said shaft member is connected to steer the vehicle in one of space, the atmosphere, land and sea.

20. The apparatus of claim 18, comprising a plurality of the apparatus.

21. The apparatus of claim 17 wherein said vehicle can be propelled on land.

22. The apparatus of claim 17, wherein said vehicle can be propelled in the atmosphere.

23. The apparatus of claim 17, wherein said vehicle can be propelled in the sea.

24. The apparatus of claim 17, wherein said vehicle can be propelled in space.

* * * * *